(12) United States Patent
Sasaki et al.

(10) Patent No.: US 10,361,066 B2
(45) Date of Patent: Jul. 23, 2019

(54) ION IMPLANTATION APPARATUS

(71) Applicant: SUMITOMO HEAVY INDUSTRIES ION TECHNOLOGY CO., LTD., Tokyo (JP)

(72) Inventors: Haruka Sasaki, Ehime (JP); Katsushi Fujita, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 15/908,614

(22) Filed: Feb. 28, 2018

(65) Prior Publication Data
US 2018/0330920 A1 Nov. 15, 2018

(30) Foreign Application Priority Data
Feb. 27, 2017 (JP) .................................. 2017-035227

(51) Int. Cl.
*H01J 37/317* (2006.01)
*H01J 37/08* (2006.01)

(52) U.S. Cl.
CPC .......... *H01J 37/3171* (2013.01); *H01J 37/08* (2013.01); *H01J 2237/006* (2013.01);
(Continued)

(58) Field of Classification Search
CPC .. H01J 37/3171; H01J 37/08; H01J 2237/006; H01J 2237/0473;
(Continued)

(56) References Cited

U.S. PATENT DOCUMENTS 5,998,798 A * 12/1999 Halling ................. H01J 37/304
250/252.1
6,627,874 B1 * 9/2003 Yefchak ................. H01J 41/12
250/281
(Continued)

FOREIGN PATENT DOCUMENTS

JP H08-115700 A 5/1996
JP 2621354 B2 6/1997
(Continued)

OTHER PUBLICATIONS

Haruka Sasaki et al., "Method of Beam Energy Adjustment by Using Beam Parallelism."

*Primary Examiner* — Nicole M Ippolito
(74) *Attorney, Agent, or Firm* — Michael Best & Friedrich LLP

(57) ABSTRACT

An ion implantation apparatus includes an ion source that is capable of generating a calibration ion beam including a multiply charged ion which has a known energy corresponding to an extraction voltage, an upstream beamline that includes amass analyzing magnet and a high energy multistage linear acceleration unit, an energy analyzing magnet, a beam energy measuring device that measures an energy of the calibration ion beam downstream of the energy analyzing magnet, and a calibration sequence unit that produces an energy calibration table representing a correspondence relation between the known energy and the energy of the calibration ion beam measured by the beam energy measuring device. An upstream beamline pressure is adjusted to a first pressure during an ion implantation process, and is adjusted to a second pressure higher than the first pressure while the energy calibration table is produced.

12 Claims, 12 Drawing Sheets

(52) U.S. Cl.
CPC . *H01J 2237/0473* (2013.01); *H01J 2237/055* (2013.01); *H01J 2237/24585* (2013.01); *H01J 2237/30433* (2013.01)

(58) Field of Classification Search
CPC ....... H01J 2237/055; H01J 2237/24585; H01J 2237/30433
USPC ... 250/492.1, 492.2, 492.21, 492.22, 492.23, 250/492.3
See application file for complete search history.

(56) References Cited

U.S. PATENT DOCUMENTS

| | | | |
|---|---|---|---|
| 9,343,263 B2 | 5/2016 | Sasaki et al. | |
| 2002/0130277 A1* | 9/2002 | Halling | H01J 37/304 250/492.21 |
| 2003/0160179 A1* | 8/2003 | Yeh | H01J 37/08 250/423 R |

FOREIGN PATENT DOCUMENTS

| | | |
|---|---|---|
| JP | 2765111 B2 | 6/1998 |
| JP | 3560154 B2 | 9/2004 |
| JP | 2015-176750 A | 10/2015 |

* cited by examiner

132

ION IMPLANTATION APPARATUS

RELATED APPLICATIONS

Priority is claimed to Japanese Patent Application No. 2017-035227, filed Feb. 27, 2017, the entire content of which is incorporated herein by reference.

BACKGROUND

Technical Field

Certain embodiments of the present invention relate to an ion implantation apparatus.

Description of Related Art

An ion implantation apparatus including a high-frequency linear accelerator is well-known. Such an ion implantation apparatus is typically used in high energy ion implantation. An ion beam that is accelerated or decelerated by the high-frequency linear accelerator basically has a certain energy width. That is, the ion beam exiting from the high-frequency linear accelerator includes not only an ion having a desired energy but also an ion having a higher (or lower) energy than the desired energy. A beam energy measuring device is suggested so as to measure the energy of the ion beam in the ion implantation apparatus. The beam energy measuring device can be applied to a high energy ion implanter.

SUMMARY

According to an embodiment of the present invention, there is provided an ion implantation apparatus including an ion source that is capable of generating a calibration ion beam including a multiply charged ion which has a known energy corresponding to an extraction voltage, an upstream beamline that is disposed downstream of the ion source and includes a mass analyzing magnet and a high-frequency linear accelerator, an energy analyzing magnet that is disposed downstream of the upstream beamline, a beam energy measuring device that measures an energy of the calibration ion beam downstream of the energy analyzing magnet, an upstream beamline pressure adjusting device that is connected to the upstream beamline so as to adjust an upstream beamline pressure to a first pressure during an ion implantation process, and a calibration sequence unit that produces an energy calibration table representing a correspondence relation between the known energy and the energy of the calibration ion beam measured by the beam energy measuring device. The calibration sequence unit controls the upstream beamline pressure adjusting device so as to adjust the upstream beamline pressure to a second pressure higher than the first pressure while producing the energy calibration table.

DETAILED DESCRIPTION

A measuring device generally requires calibration. The same applies to a beam energy measuring device in an ion implantation apparatus. A calibration ion beam having a known energy is measured by the measuring device so as to calibrate the beam energy measuring device. A correspondence relation between the measured energy and the known energy is used for calibration in actual beam energy measurement. By using the correspondence relation, the measurement result of an ion beam having an unknown energy can be corrected. In the case of applying the measuring device to a high energy ion implanter, it is desirable to perform the measurement for calibration not only in a low energy region but also in a high energy region.

However, it is not easy to generate a calibration ion beam having a known "high" energy. For example, an ion beam subjected to high-frequency acceleration (referred to as a radio frequency (RF) beam) has a high energy but also has an energy width as described above. Thus, it is difficult to accurately specify the magnitude of the energy of the ion beam subjected to high-frequency acceleration. This acts as a constraint on improving the accuracy of calibration.

It is desirable to improve the accuracy of calibration for beam energy measurement in an ion implantation apparatus.

Any combination of the above constituents or substitution of the constituents or representations of the present invention with each other among a method, an apparatus, a system, a computer program, a data structure, a recording medium, and the like is also effective as an embodiment of the present invention.

According to the present invention, the accuracy of calibration for beam energy measurement in an ion implantation apparatus can be improved.

Hereinafter, embodiments of the present invention will be described in detail with reference to the drawings. In the description and the drawings, the same or corresponding constituents, members, and processes will be designated with the same reference signs. Descriptions of the same or corresponding constituents, members, and processes will not be repeated accordingly. The scale or shape of each illustrated unit is set for convenience so as to facilitate description and is not to be restrictively interpreted unless otherwise specified. The embodiments are for illustrative purposes. The scope of the present invention is not limited to the embodiments. All described features in the embodiments and combinations of the features may not be essential to the invention.

Figure 1:
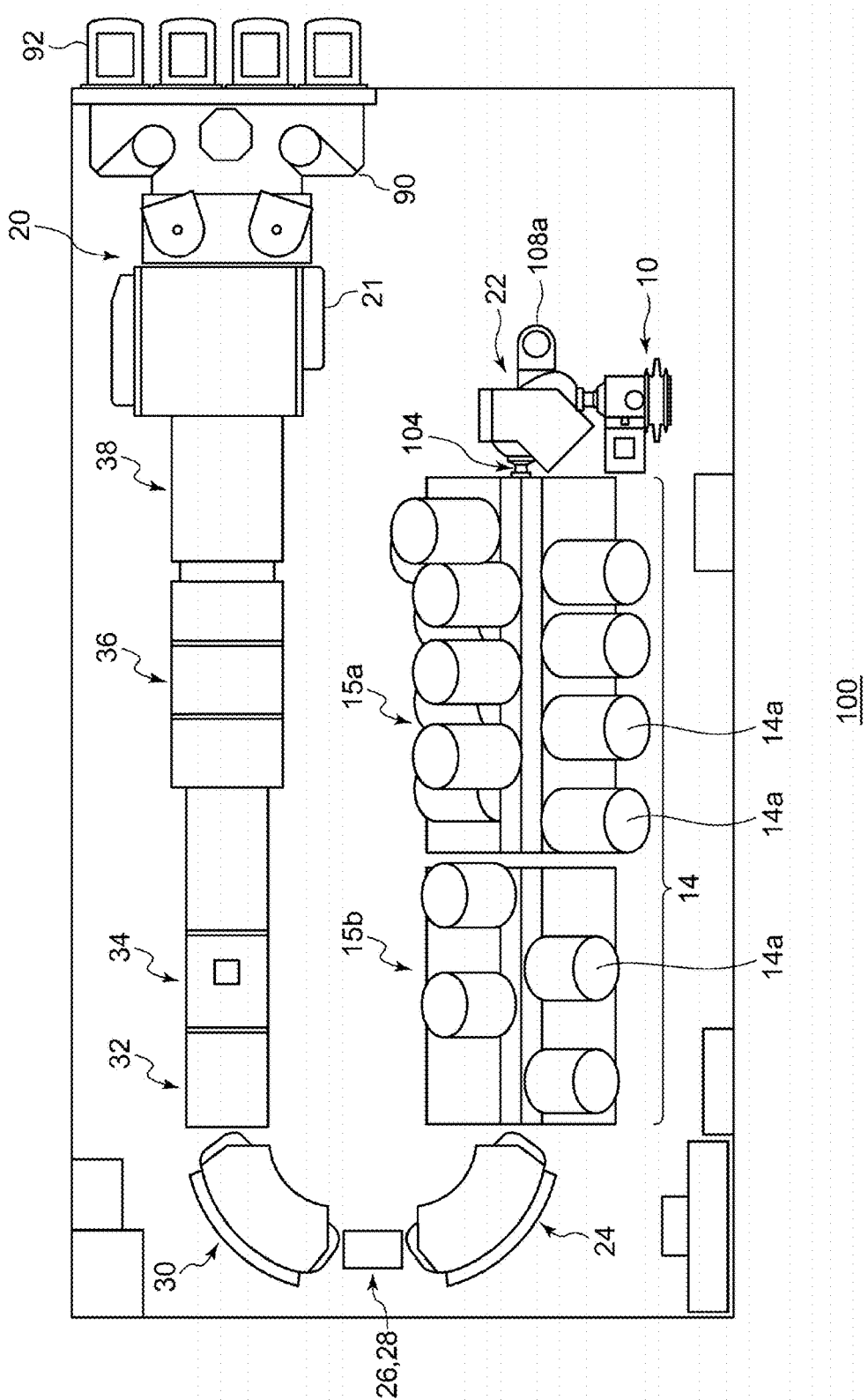
FIG. 1 is a top view schematically illustrating an ion implantation apparatus according to an embodiment of the present invention.
Figure 2:
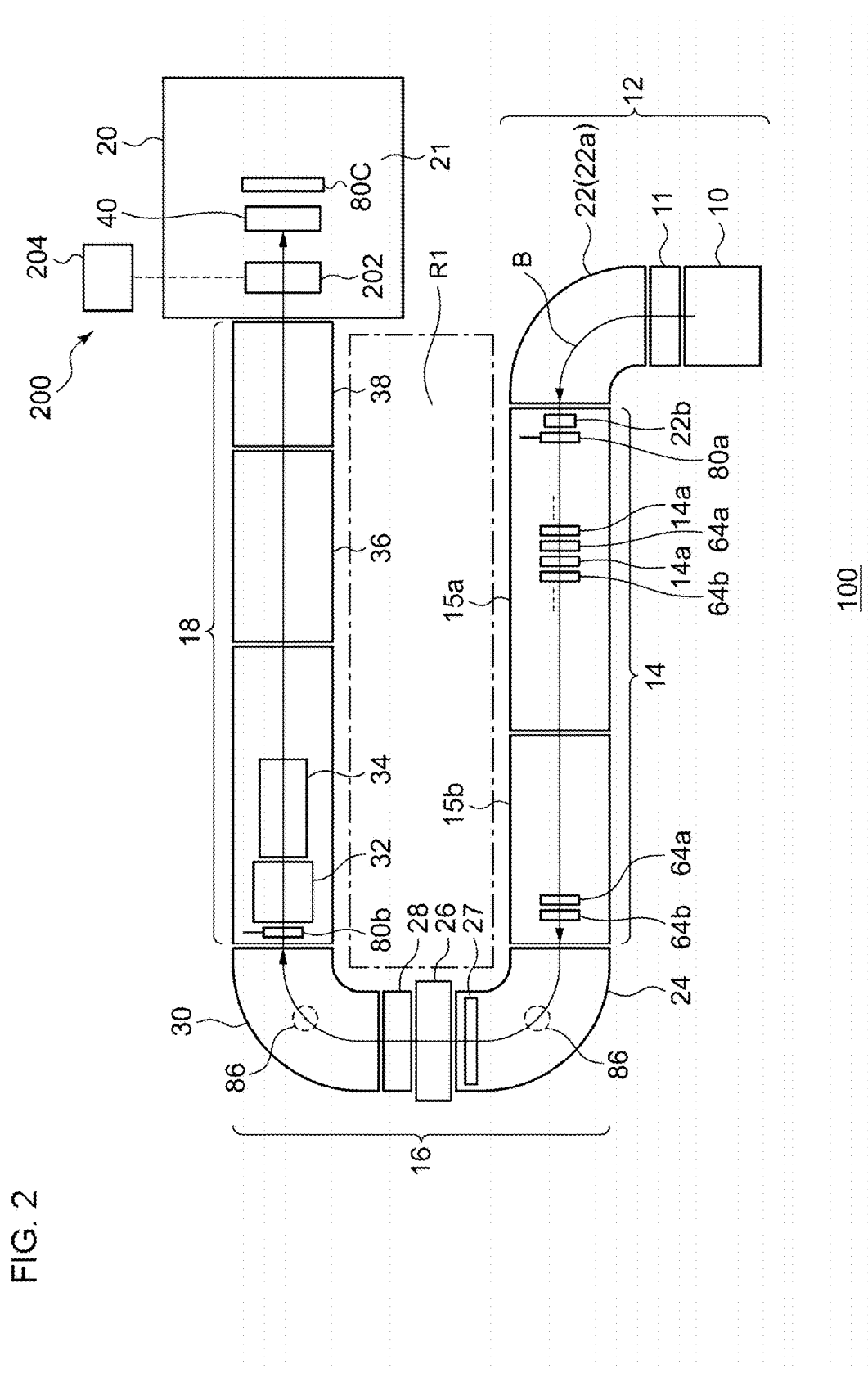
FIG. 2 is a diagram schematically illustrating arrangement of constituents of the ion implantation apparatus illustrated in FIG. 1.

FIG. 1 is a top view schematically illustrating an ion implantation apparatus 100 according to an embodiment of the present invention. FIG. 2 is a diagram schematically illustrating arrangement of constituents of the ion implantation apparatus 100 illustrated in FIG. 1. The ion implantation apparatus 100 is a so-called high energy ion implanter. The high energy ion implanter is an ion implantation apparatus that includes an ion accelerator with high-frequency linear acceleration and a high energy ion transfer beamline. The high energy ion implanter accelerates an ion generated in an ion source 10 to a high energy, transfers an acquired ion beam B to a processed object (for example, a substrate or a wafer 40) along the beamline, and implants the ion into the processed object.

As illustrated in FIG. 1 and/or FIG. 2, the ion implantation apparatus 100 includes an ion beam generating unit 12, a high energy multistage linear acceleration unit 14, a beam deflecting unit 16, a beam transfer line unit 18, and a substrate processing and transferring unit 20. The ion beam generating unit 12 generates an ion beam and analyzes the mass of the ion. The high energy multistage linear acceleration unit 14 accelerates an ion supplied from the ion beam generating unit 12 in accordance with an acceleration parameter. The beam deflecting unit 16 bends the trajectory of the ion beam B in a U shape. The beam transfer line unit 18 transfers the ion beam B to the wafer 40. The substrate processing and transferring unit 20 implants the transferred ion beam B into the semiconductor wafer.

The ion beam generating unit 12 includes the ion source 10, an extraction electrode 11, and a mass analyzer 22 as illustrated in FIG. 2. In the ion beam generating unit 12, a beam is extracted from the ion source 10 and accelerated through the extraction electrode 11, and the mass of the extracted and accelerated beam is analyzed by the mass analyzer 22. The mass analyzer 22 includes a mass analyzing magnet 22a and a mass resolving slit 22b. The mass resolving slit 22b is disposed in an inlet portion of the high energy multistage linear acceleration unit 14 that is a constituent subsequent to the mass analyzer 22. The mass resolving slit 22b may be disposed immediately in the rear of the mass analyzing magnet 22a (that is, immediately in front of the high energy multistage linear acceleration unit 14).

A first beam measurer 80a that measures the total beam current of the ion beam is disposed in the foremost portion of a linear acceleration unit housing of the high energy multistage linear acceleration unit 14. The first beam measurer 80a is configured to be movable to or from the beam trajectory in the vertical direction by a drive mechanism. For example, the first beam measurer 80a is a Faraday cup. This Faraday cup is referred to as an injector Faraday cup. The injector Faraday cup is configured to have an oblong box shape that is long in the vertical direction, and have an opening portion toward the upstream side of the beamline. The first beam measurer 80a is used for measuring the total beam current of the ion beam B when adjusting the ion source 10 and/or the mass analyzing magnet 22a. If necessary, the first beam measurer 80a may be used for completely blocking the ion beam B that reaches the downstream side of the beamline on the beam trajectory.

Only ion species that are required for implantation are selected as a result of mass analysis performed by the mass analyzer 22. The ion beam B having the selected ion species is guided to the high energy multistage linear acceleration unit 14. The high energy multistage linear acceleration unit 14 includes a first linear accelerator 15a that is used in typical high energy ion implantation. The first linear accelerator 15a includes one or more (for example, a plurality of) high-frequency resonators 14a. The high energy multistage linear acceleration unit 14 may include a second linear accelerator 15b in addition to the first linear accelerator 15a. The second linear accelerator 15b is used for ultra high energy ion implantation along with the first linear accelerator 15a. The second linear accelerator 15b includes one or more (for example, a plurality of) high-frequency resonators 14a. The beam deflecting unit 16 changes the direction of the ion beam B accelerated by the high energy multistage linear acceleration unit 14.

The first linear accelerator 15a includes the plurality of high-frequency resonators 14a and a plurality of focusing and defocusing lenses 64. Each high-frequency resonator 14a includes a cylindrical electrode. For example, each focusing and defocusing lens 64 is an electric field lens (for example, an electrostatic quadrupole electrode (Q lens)). Each focusing and defocusing lens 64 maybe a magnetic field lens (for example, a quadrupole electromagnet). The cylindrical electrodes and the focusing and defocusing lenses 64 (for example, Q lenses) in the high-frequency resonators 14a are alternately arranged linearly. The ion beam B passes through the center of the alternately arranged cylindrical electrodes and the focusing and defocusing lenses 64. The second linear accelerator 15b also includes the plurality of high-frequency resonators 14a and the plurality of focusing and defocusing lenses 64 in the same manner as the first linear accelerator 15a.

Each focusing and defocusing lens 64 is disposed to efficiently transfer the ion beam B by controlling convergence and divergence of the ion beam B during acceleration or after acceleration. A required number of the focusing and defocusing lenses 64 are disposed inside or in front of and in the rear of the high-frequency linear accelerator. Horizontal focusing lenses 64a and vertical focusing lenses 64b are alternately arranged. That is, each horizontal focusing lens 64a is disposed in front (or in the rear) of the cylindrical electrode of each high-frequency resonator 14a, and each vertical focusing lens 64b is disposed in the rear (or in front) of the cylindrical electrode of each high-frequency resonator 14a. An additional vertical focusing lens 64b is disposed in the rear of the last horizontal focusing lens 64a at the end of the second linear accelerator 15b. Convergence and divergence of the ion beam B passing through the high energy multistage linear acceleration unit 14 are adjusted. Accordingly, the ion beam B having an optimal two-dimensional beam profile is incident into the beam deflecting unit 16 downstream of the high energy multistage linear acceleration unit 14.

An amplitude V [kV] and a frequency f [Hz] of a voltage applied to the cylindrical electrode of each high-frequency resonator 14a are considered as high-frequency (RF) acceleration parameters in the high-frequency linear accelerator. In the case of performing high-frequency acceleration in a plurality of stages, a phase φ [deg] between the high-frequency resonators 14a is added to the acceleration parameters. The amplitude V, the frequency f, and the phase φ are high-frequency (RF) parameters. The frequency f may have a fixed value. An operating parameter (referred to as a focusing and defocusing parameter) of each focusing and defocusing lens 64 is also considered. For example, the focusing and defocusing parameter is a Q lens voltage.

The high energy ion beam B exiting from the high energy multistage linear acceleration unit 14 has a certain range of energy distribution. Thus, it is desirable to analyze the beam energy with high accuracy, correct the beam trajectory, and adjust convergence and divergence of the beam in advance so as to irradiate the wafer 40 with the ion beam B with desired implantation accuracy after scanning and parallelizing of the high energy ion beam B.

The beam deflecting unit 16 analyzes the energy of the high energy ion beam, corrects the beam central trajectory, and controls energy dispersion. The beam deflecting unit 16 includes at least two high-accuracy deflecting electromagnets, at least one energy width restricting slit, at least one energy resolving slit, and at least one horizontal focusing device. The plurality of deflecting electromagnets is configured to analyze the energy of the high energy ion beam, accurately correct an ion implantation angle, and suppress the energy dispersion.

The beam deflecting unit 16 includes an energy analyzing magnet 24, an energy width restricting slit 27, a horizontal focusing quadrupole lens 26, an energy resolving slit 28, and a steering magnet 30 in order from the upstream side. The energy analyzing magnet 24 is disposed downstream of the high energy multistage linear acceleration unit 14. The horizontal focusing quadrupole lens 26 suppresses energy dispersion. The steering magnet 30 provides beam steering (corrects the beam trajectory). The beam deflecting unit 16 changes the direction of the ion beam B, and the ion beam B is directed to the wafer 40.

A second beam measurer 80b that measures the beam current is disposed downstream of the energy resolving slit 28. The second beam measurer 80b is disposed in the foremost portion in a scanner housing, that is, immediately in front of a beam shaper 32. The second beam measurer 80b is configured to be movable to or from the beam trajectory in the vertical direction by a driving mechanism. For example, the second beam measurer 80b is a Faraday cup. This Faraday cup is referred to as a resolver Faraday cup. The resolver Faraday cup is configured to have an oblong box shape that is long in the vertical direction, and have an opening portion toward the upstream side of the beamline. The second beam measurer 80b is used for measuring the total beam current of the ion beam B when adjusting the high energy multistage linear acceleration unit 14 and/or the beam deflecting unit 16. If necessary, the second beam measurer 80b maybe used for completely blocking the ion beam B that reaches the downstream side of the beamline on the beam trajectory.

The energy analyzing magnet 24 is one of the plurality of deflecting electromagnets of the beam deflecting unit 16 that is on the most upstream side. The energy analyzing magnet 24 is referred to as an energy filter magnet (EFM). The steering magnet 30 is one of the plurality of deflecting electromagnets of the beam deflecting unit 16 and is on the most downstream side.

An ion that passes through each deflecting electromagnet of the beam deflecting unit 16 is subjected to a centrifugal force and a Lorentz force, and the centrifugal force and the Lorentz force in equilibrium cause the ion to have an arc trajectory. This equilibrium is represented as a general formula $mv=qBr$. The mass of the ion is denoted by m. The velocity of the ion is denoted by v. The electric charge of the ion is denoted by q. The magnetic flux density in each deflecting electromagnet is denoted by B. The radius of curvature of the trajectory is denoted by r. Only the ion of which the radius of curvature r of the trajectory matches the radius of curvature of the center of a magnetic pole of each deflecting electromagnet can pass through the deflecting electromagnet. In other words, if ions have the same charge state, only the ion having a specific momentum my can pass through each deflecting electromagnet in which a constant magnetic field is applied. The energy analyzing magnet 24 is actually a device that analyzes the momentum of the ion. The steering magnet 30 and the mass analyzing magnet 22a are also momentum filters.

The beam deflecting unit 16 can deflect the ion beam B by 180 degrees using a plurality of magnets. Accordingly, a high energy ion implanter including a U-shaped beamline can be realized with a simple configuration. The energy analyzing magnet 24 and the steering magnet 30 are configured to have a deflection angle of 90 degrees. Consequently, the energy analyzing magnet 24 and the steering magnet 30 are configured to have a total deflection angle of 180 degrees. The deflection amount of one magnet is not limited to 90 degrees. The following combinations may also be used.

(1) One magnet having a deflection amount of 90 degrees and two magnets each having a deflection amount of 45 degrees (2) Three magnets each having a deflection amount of 60 degrees (3) Four magnets each having a deflection amount of 45 degrees (4) Six magnets each having a deflection amount of 30 degrees (5) One magnet having a deflection amount of 60 degrees and one magnet having a deflection amount of 120 degrees (6) One magnet having a deflection amount of 30 degrees and one magnet having a deflection amount of 150 degrees The accuracy of the magnetic field is required to be high in the energy analyzing magnet 24. Thus, a high-accuracy magnetic field measurer 86 that accurately measures a magnetic field is installed to the energy analyzing magnet 24. The magnetic field measurer 86 is configured by appropriately combining a nuclear magnetic resonance (NMR) probe with a Hall probe. The NMR probe is referred to as a magnetic resonance probe (MRP). The MRP is used in calibration of the Hall probe, and the Hall probe is used for constant feedback control of the magnetic field. The energy analyzing magnet 24 is produced with high accuracy such that the non-uniformity of the magnetic field is less than 0.01%. The magnetic field measurer 86 is also disposed in the steering magnet 30. Only the Hall probe may be attached to the magnetic field measurer 86 of the steering magnet 30. A power supply having current setting accuracy and current stability less than $1\times10^{-4}$, and a control device for the power supply are connected to each of the energy analyzing magnet 24 and the steering magnet 30.

The beam transfer line unit 18 transfers the ion beam B exiting from the beam deflecting unit 16. The beam transfer line unit 18 includes the beam shaper 32 configured with a focusing and defocusing lens group, abeam scanner 34, a beam parallelizer 36, and an electrostatic final energy filter 38. The final energy filter 38 includes a final energy resolving slit. The length of the beam transfer line unit 18 is designed in accordance with the total length of the ion beam generating unit 12 and the high energy multistage linear acceleration unit 14. The beam transfer line unit 18 is connected with the high energy multistage linear acceleration unit 14 via the beam deflecting unit 16. The beam transfer line unit 18, the beam deflecting unit 16, and the high energy multistage linear acceleration unit 14 as a whole form a U-shaped layout.

The substrate processing and transferring unit 20 is disposed at the downstream end of the beam transfer line unit 18. The substrate processing and transferring unit 20 includes a vacuum process chamber 21 in which the wafer 40 is irradiated with the ion beam B in the implantation process. The vacuum process chamber 21 accommodates a beam monitor, a charge neutralizing device, a wafer transporting mechanism, an electrostatic chuck (ESC), and a wafer scanning mechanism. The beam monitor measures the beam current, the position, the implantation angle, the convergence and divergence angle, the ion distribution in the vertical direction and the horizontal direction, and the like of the ion beam B. The charge neutralizing device prevents the wafer 40 from being charged with the ion beam B. The wafer transporting mechanism transports the wafer 40 into or out of the vacuum process chamber 21 and sets the wafer 40 in an appropriate position at an appropriate angle. The ESC holds the wafer 40 during ion implantation. The wafer scanning mechanism moves the wafer 40 in a direction perpendicular to a beam scanning direction at a speed corresponding to a change in beam current during implantation.

A third beam measurer 80$c$ is disposed downstream of an ion implantation position in the substrate processing and transferring unit 20. For example, the third beam measurer 80$c$ is a fixed horizontally long Faraday cup that measures the total beam current of the ion beam B. This horizontally long Faraday cup is referred to as a tuning Faraday cup. The third beam measurer 80$c$ has a beam current measuring function to measure the ion beam B over the entire scanning range in the wafer area. The third beam measurer 80$c$ is configured to measure the final set-up beam in the most downstream of the beamline.

In the substrate processing and transferring unit 20, a wafer transporting device 90 is disposed adjacent to the vacuum process chamber 21 as illustrated in FIG. 1. The wafer transporting device 90 includes an intermediate transporting chamber, a load lock chamber, and an atmospheric transporting unit. The wafer transporting device 90 is configured to transport the processed object such as the wafer stored in a wafer cassette on a cassette station 92 into the vacuum process chamber 21. The wafer is transported into the vacuum process chamber 21 from the wafer cassette on the cassette station 92 via the atmospheric transporting unit, the load lock chamber, and the intermediate transporting chamber. The wafer subjected to the ion implantation process is transported from the vacuum process chamber 21 to the cassette station 92 via the intermediate transporting chamber, the load lock chamber, and the atmospheric transporting unit.

The beamline unit of the ion implantation apparatus 100 is configured as a horizontal U-shaped folded beamline including two long linear portions facing each other. The upstream long linear portion is configured with a plurality of units accelerating the ion beam B generated in the ion source 10. The downstream long linear portion is configured with a plurality of units adjusting the ion beam B and implanting the ion beam B into the wafer 40 after the direction of the ion beam B is changed with respect to the upstream long linear portion. The two long linear portions are configured to have approximately the same length. A workspace R1 having a sufficient area for machine maintenance work is disposed between the two long linear portions.

The high energy ion implanter in which units are disposed in a U shape has a reduced foot print and provides favorable workability. In the high energy ion implanter, each unit or device may be configured as a module so as to be installed, uninstalled, or combined with each other in accordance with a beamline reference position.

Disposing the high energy multistage linear acceleration unit 14 and the beam transfer line unit 18 in a folded shape can reduce the total length of the high energy ion implanter. The high energy multistage linear acceleration unit 14 and the beam transfer line unit 18 are disposed approximately linearly in an apparatus in the related art. The radius of curvature of each of the plurality of deflecting electromagnets constituting the beam deflecting unit 16 is optimized to minimize the width of the apparatus. Accordingly, the foot print of the apparatus is minimized, and operation can be performed for each device of the high energy multistage linear acceleration unit 14 or the beam transfer line unit 18 in the workspace R1 interposed between the high energy multistage linear acceleration unit 14 and the beam transfer line unit 18. The ion source 10 that has a comparatively short maintenance interval is disposed adjacent to the substrate processing and transferring unit 20 in which the substrate is required to be transferred into and out of. Thus, the movement of workers can be reduced.

Figure 3:
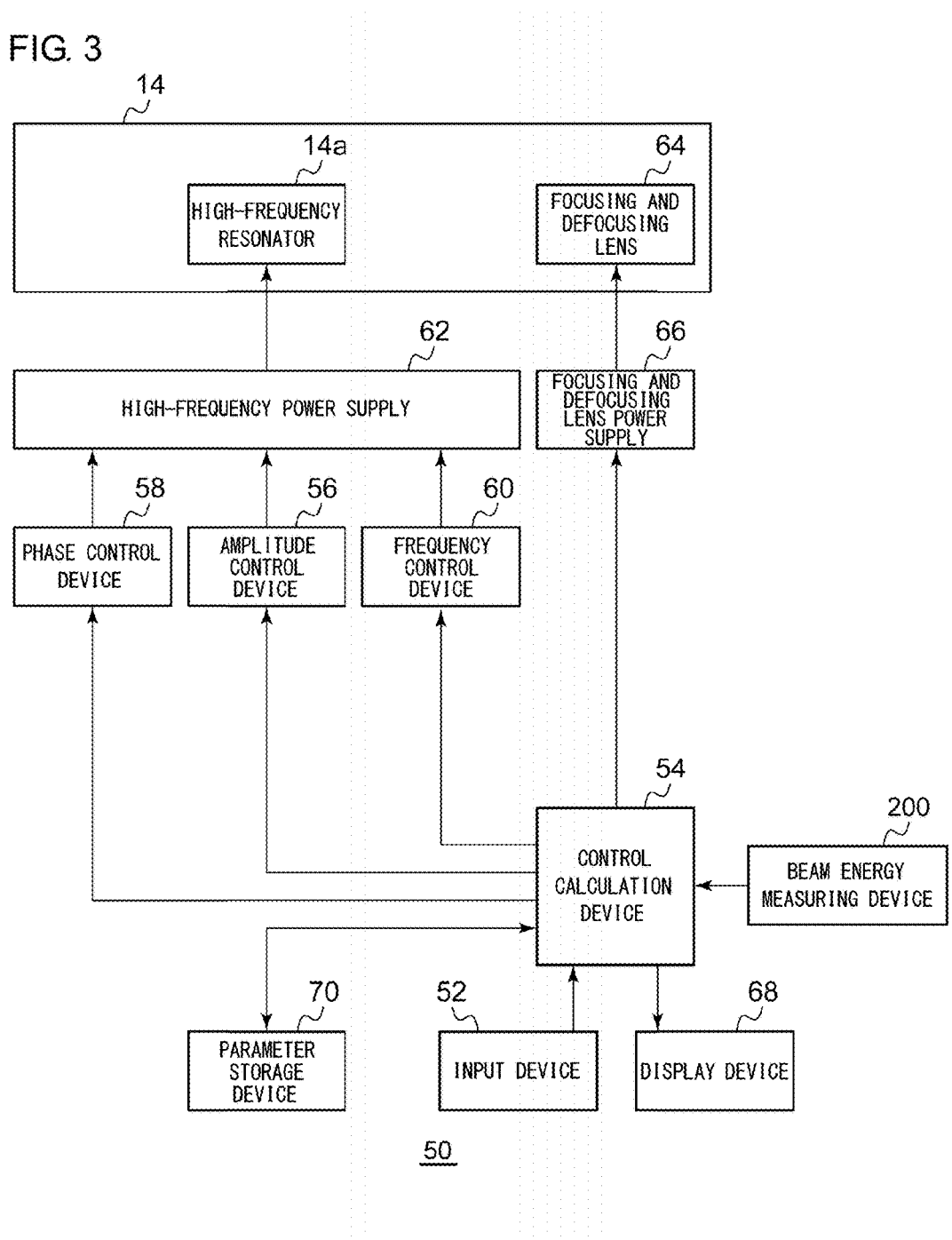
FIG. 3 is a block diagram illustrating a schematic configuration of a controller for a high energy multistage linear acceleration unit illustrated in FIG. 1 and FIG. 2.

FIG. 3 is a block diagram illustrating a schematic configuration of a control device 50 of the ion implantation apparatus 100 illustrated in FIG. 1 and FIG. 2. The control device 50 is configured to control the high energy multistage linear acceleration unit 14. Constituents that are disposed in the control device 50 for control of the high energy multistage linear acceleration unit 14 include an input device 52, a control calculation device 54, an amplitude control device 56, a phase control device 58, a frequency control device 60, a high-frequency power supply 62 for each high-frequency resonator 14$a$, a focusing and defocusing lens power supply 66 for each focusing and defocusing lens 64, a display device 68, and a parameter storage device 70. An operator inputs a required condition into the input device 52. The control calculation device 54 calculates the numerical values of various parameters based on the input condition and controls each constituent. The amplitude control device 56 adjusts the voltage amplitude of the high-frequency power. The phase control device 58 adjusts the phase of the high-frequency power. The frequency control device 60 controls the frequency of the high-frequency power. The display device 68 displays the acceleration parameters, the focusing and defocusing parameter, and other information. The parameter storage device 70 stores determined parameters.

An implantation condition and/or an initial condition for parameter calculation based on the implantation condition is input into the input device 52. For example, the input condition includes the extraction voltage of the extraction electrode 11, the mass of the ion, and the charge state of the ion as incidence conditions, and the final energy as an exiting condition.

The control calculation device 54 for the high-frequency linear accelerator incorporates a numerical value calculation code (program) for calculating the numerical values of various parameters in advance. By using the incorporated numerical value calculation code, the control calculation device 54 simulates the acceleration and the convergence and divergence of the ion beam based on the input condition and calculates the acceleration parameters (the voltage amplitude, the frequency, and the phase) to achieve the optimal transfer efficiency. The control calculation device 54 also calculates the operating parameter (for example, a Q electrode voltage or a Q coil current) of each focusing and defocusing lens 64 so as to efficiently transfer the ion beam. The input condition and various calculated parameters are displayed on the display device 68. When an acceleration condition that exceeds the performance of the high energy multistage linear acceleration unit 14 is input, an indication that means that any solution is not found is displayed on the display device 68. One example of a method of calculating the acceleration parameters and the focusing and defocusing parameter is disclosed in detail in, Japanese Patent No. 3448731, the entirety of which is incorporated herein by reference.

The voltage amplitude parameter is sent to the amplitude control device 56 from the control calculation device 54, and the amplitude control device 56 adjusts the amplitude of the high-frequency power supply 62. The phase parameter is sent to the phase control device 58, and the phase control device 58 adjusts the phase of the high-frequency power supply 62. The frequency parameter is sent to the frequency control device 60. The frequency control device 60 controls the output frequency of the high-frequency power supply 62 and controls the resonant frequency of each high-frequency resonator 14a of the high energy multistage linear acceleration unit 14. The control calculation device 54 controls the focusing and defocusing lens power supply 66 by using the calculated focusing and defocusing parameter.

The control calculation device 54 may be configured to control other constituents of the ion implantation apparatus 100 (for example, at least one constituent included in any of the ion beam generating unit 12, the beam deflecting unit 16, the beam transfer line unit 18, and the substrate processing and transferring unit 20). The control calculation device 54 may control at least one constituent of the ion implantation apparatus 100 (for example, the high energy multistage linear acceleration unit 14) based on the measurement result of at least one measuring unit of the ion implantation apparatus 100 (for example, the beam energy measuring device 200).

Figure 4:
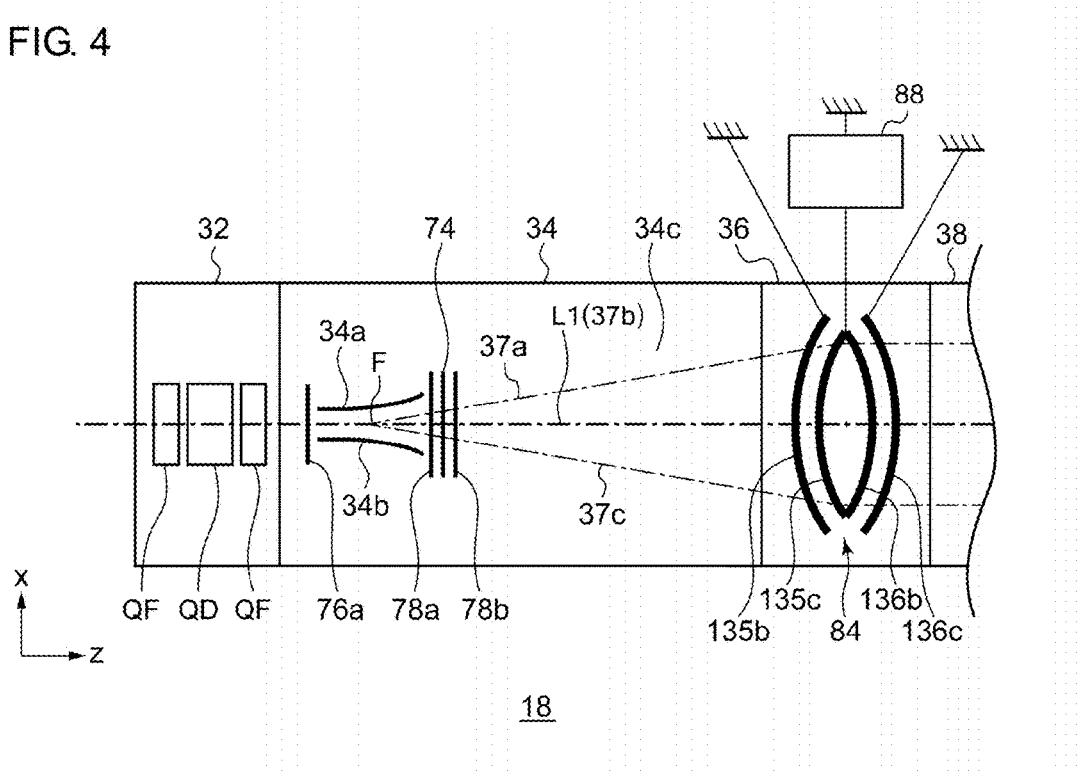
FIG. 4 is a plan view illustrating a schematic configuration of a part of a beam transfer line unit illustrated in FIG. 1.

FIG. 4 is a plan view illustrating a schematic configuration of a part of the beam transfer line unit 18. The beam having required ion species with a required energy value which is separated by the beam deflecting unit 16 (refer to FIG. 1 and FIG. 2) is shaped to have a desired sectional shape by the beam shaper 32. As illustrated in FIG. 4, the beam shaper 32 is configured with a (electric field or magnetic field) focusing/defocusing lens group such as Q (quadrupole) lenses. For example, the beam shaper 32 is configured as a triplet Q lens group configured with a horizontally focusing (vertically defocusing) lens QF, a horizontally defocusing (vertically focusing) lens QD, and a horizontally focusing (vertically defocusing) lens QF. If necessary, the beam shaper 32 can be configured to have one horizontally focusing lens QF or one horizontally defocusing lens QD, or a plurality of horizontally focusing lenses QF and a plurality of horizontally defocusing lenses QD in combination. The beam having the adjusted sectional shape is scanned by the beam scanner 34 in a direction parallel to the page of FIG. 4.

The beam scanner 34 is a deflection scanning device (referred to as a beam scanner) that reciprocatingly scans the ion beam in the horizontal direction orthogonal to the traveling direction of the ion beam periodically by using a periodically changing electric field.

The beam scanner 34 includes one pair (two) of opposite electrodes 34a and 34b (dipole deflection scanning electrodes) that are disposed along the beam traveling direction to face each other interposing an ion beam passage area. A scanning voltage that is approximated to a triangular wave changing positively and negatively at a constant frequency in the range of 0.5 Hz to 4,000 Hz is applied antithetically to the two opposite electrodes 34a and 34b. This scanning voltage generates a changing electric field in a space between the two opposite electrodes 34a and 34b. The electric field deflects the beam passing through the gap. A periodic change in scanning voltage scans the beam passing through the gap in the horizontal direction.

A suppression electrode 74 that includes an opening in the ion beam passage area is disposed between two ground electrodes 78a and 78b on the downstream side of the beam scanner 34. A ground electrode 76a is disposed in front of the scanning electrode on the upstream side of the beam scanner 34. However, if necessary, a suppression electrode with the same configuration as the suppression electrode 74 on the downstream side may be disposed on the upstream of the beam scanner 34. The suppression electrode suppresses electrons entering a positive electrode.

In a scanning housing, a beam scanning space portion 34c is disposed across a long section on the downstream side of the beam scanner 34. The beam scanning space portion 34c is configured to achieve a sufficient scanning width even at a narrow beam scanning angle. The beam parallelizer 36 that adjusts the deflected ion beam to be in the direction of the ion beam before beam scanning deflection, that is, the beam parallelizer 36 that bends the deflected ion beam back to be in parallel with a designed reference beam trajectory (hereinafter, referred to as a beam trajectory L1), is disposed downstream of the scanning housing downstream of the beam scanning space portion 34c.

An aberration that is generated in the beam parallelizer 36 (the difference in focal length between the center portion and the left or right end portion of the beam parallelizer) is proportional to the square of the deflection angle of the beam scanner 34. Thus, decreasing the deflection angle by lengthening the beam scanning space portion 34c significantly contributes to a reduction in the aberration of the beam parallelizer 36. A large aberration causes a difference in beam size and beam divergence angle between the center portion and the left or right end portion of the wafer when the ion beam is implanted into the semiconductor wafer. Thus, the quality of the product may vary.

Adjusting the length of the beam scanning space portion 34c enables the length of the beam transfer line unit to be set in accordance with the length of the high energy multistage linear acceleration unit 14.

A parallelizing lens 84 is disposed in the beam parallelizer 36. As illustrated in FIG. 4, the parallelizing lens 84 is configured with a plurality of a pair of acceleration electrodes and a pair of deceleration electrodes in an approximately hyperbolic shape. Each of the pair of electrodes faces each other interposing an acceleration or deceleration gap which has a width that does not cause electric discharge. An electric field is formed in the acceleration or deceleration gap. The electric field has an axial-direction component parallel to the designed reference ion beam trajectory that causes acceleration and deceleration of the ion beam, and a horizontal component that has an intensity increasing in proportion to the distance from a reference axis and causes the ion beam to converge in the horizontal direction.

The downstream side electrode of the pair of electrodes having the acceleration gap interposed therebetween forms a single structure with the upstream side electrode of the deceleration gap to have the same electric potential. Similarly, the downstream side electrode of the deceleration gap may form a single structure with an upstream side electrode of a next acceleration gap to have the same electric potential (not shown).

The first electrode (incidence electrode) and the last electrode (exiting electrode) of the parallelizing lens 84 have a ground electric potential. Accordingly, the energy of the beam is not changed before and after the beam passes through the parallelizing lens 84.

In the intermediate electrode structure, a negative power supply 88 having a variable settable constant voltage is connected to the outlet-side electrode of the acceleration gap and the inlet-side electrode of the deceleration gap. A positive power supply having a variable constant voltage is connected to the outlet-side electrode of the deceleration gap and the inlet-side electrode of the acceleration gap (when there are a plurality of pairs of acceleration gap and deceleration gap, the order of power supply type is negative, positive, negative, positive, negative, . . . ). Accordingly, the ion beam is directed stepwise to a direction parallel to the reference trajectory of the beamline while being repeatedly accelerated and decelerated. Finally, the ion beam has a trajectory that is parallel to the traveling direction of the ion beam before deflection scanning (beamline trajectory direction).

As illustrated in FIG. 4, the beam parallelizer 36 has a focal point F on the designed reference beam trajectory (for example, the beam trajectory L1 illustrated in FIG. 4). A plurality of beam trajectories 37a, 37b, and 37c incident into the beam parallelizer 36 have different angles with respect to the reference beam trajectory respectively. The beam parallelizer 36 is designed to deflect each of the plurality of beam trajectories 37a, 37b, and 37c at a different deflection angle in accordance with the incidence angle thereof. Accordingly, the plurality of beam trajectories 37a, 37b, and 37c become parallel to the reference beam trajectory in the downstream side of the beam parallelizer 36. The beam parallelizer 36 is operated by receiving an electrical input (for example, a voltage) that is determined in advance in accordance with a given ion implantation condition (includes, for example, a target beam energy).

The plurality of beam trajectories 37a, 37b, and 37c are on one plane that includes the reference beam trajectory, and is directed to have a different incidence angle at the beam parallelizer 36 from the focal point F in the plane. The plurality of beam trajectories 37a, 37b, and 37c are the result of scanning performed by the beam scanner 34. Thus, the plane corresponds to a scanning plane (xz plane) of the beam scanner 34. Any of the beam trajectories (the beam trajectory 37b in case of FIG. 4) may match the reference beam trajectory. The reference beam trajectory passes straight through the beam parallelizer 36 without being deflected in the beam parallelizer 36.

The ion implantation apparatus 100 is configured such that the focal point F of the beam parallelizer 36 matches a scanning origin of the beam scanner 34. Thus, the beam traveling from the scanning origin that is scanned by the beam scanner 34 is focused by the beam parallelizer 36 that includes an electric field parallelizing lens or the like, and becomes parallel to an axis which has a deflection angle of zero degrees (reference axis) that is parallel to the traveling direction of the ion beam before scanning (beamline trajectory direction). In this case, the area of scanning is axially symmetric about the reference axis.

As described above, the beam parallelizer 36 is configured to parallelize the incident ion beam from the beam scanner 34. The beam parallelizer 36 forms, downstream of the beam parallelizer 36, the beam passage area that spreads in an x direction (horizontal direction) perpendicular to a beam transfer direction in a plane perpendicular to the beam transfer direction. For example, the beam parallelizer 36 is an electrostatic beam parallelizer.

As illustrated in FIG. 2, the beam energy measuring device 200 is disposed in the ion implantation apparatus 100. The beam energy measuring device 200 can measure the energy of the ion beam that is accelerated by using the high energy multistage linear acceleration unit 14.

The beam energy measuring device 200 includes a parallelism measuring unit 202 and an energy calculating unit 204. The parallelism measuring unit 202 is configured to measure the parallelism (hereinafter, referred to as a "beam parallelism" or "parallelism") of the ion beam downstream of the beam parallelizer 36 after the ion beam passes through the beam parallelizer 36. For example, the parallelism measuring unit 202 is disposed in the vacuum process chamber 21 in which the ion implantation process is performed on the processed object.

The beam parallelism is an indicator that indicates a beam angle error of the ion beam. For example, an indicator that indicates an error in beam angle related to a direction perpendicular to the beam trajectory L1 (x direction) in the plane determined by the plurality of beam trajectories 37a, 37b, and 37c passing through the beam parallelizer 36 may be used as the beam parallelism. The beam parallelism indicates a relative angular error between local portions of the ion beam rather than the entire angular error of the ion beam with respect to the designed reference beam trajectory.

The parallelism measuring unit 202 includes, for example, a divergence mask that has a plurality of slits, and a profiler cup that measures the beam current. The divergence mask restricts, by having the ion beam pass through the slits, the scanned beam that is parallelized by the beam parallelizer 36. The profiler cup is disposed at a predetermined distance from the divergence mask. A beam current detector such as the profiler cup is generally disposed in the vacuum process chamber 21 of the ion implantation apparatus 100 known in the related art. The beam energy measuring device 200 can be configured at low cost by using the detector known in the related art.

The parallelism measuring unit 202 measures the beam current as a function of position in the scanning direction (x direction). In an ideal case where the center of the ion beam passing through the beam scanner 34 and the beam parallelizer 36 matches the beam trajectory L1, the parallelism measuring unit 202, for example, may calculate the parallelism from the difference between the position of the local maximum beam current and the designed position of the local maximum current, and the distance between the divergence mask and the beam current detector.

The energy calculating unit 204 is configured to calculate the energy of the ion beam from the measured parallelism. The energy calculating unit 204 calculates the amount of energy difference from the target beam energy of the ion beam based on the beam parallelism. The energy calculating unit 204 may be a part of the control device 50 or may be disposed separately from the control device 50. The energy calculating unit 204 can output the calculated value of the energy of the ion beam to the control calculation device 54 and other constituents of the control device 50.

The beam parallelizer 36 parallelizes the ion beam by causing the ion beam to be deflected or focused, and the deflecting power or focusing power required for parallelizing the ion beam depends on the energy of the ion beam. That is, as the energy of the ion beam increases, larger deflecting power or focusing power is required. The deflecting power or focusing power of the beam parallelizer 36 is changed according to the electrical input (for example, a voltage in a case where the parallelizing lens 84 uses an electric field) to the beam parallelizer 36.

Figure 5A:
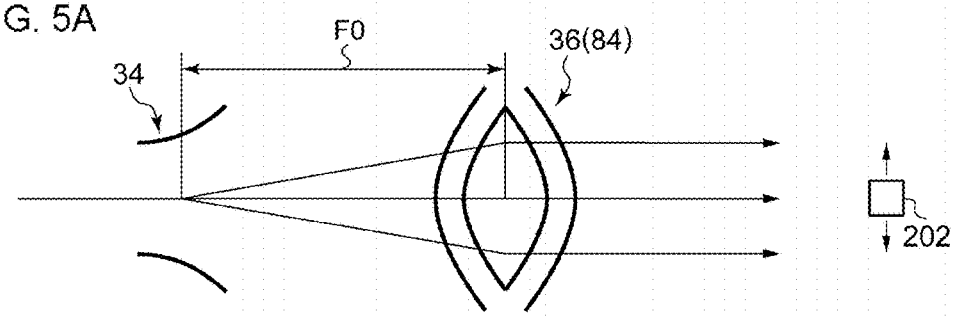
FIG. 5A, FIG. 5B, and FIG. 5C are diagrams for describing measurement of a beam parallelism.

Accordingly, a setting of the beam parallelizer 36 that correlates the target beam energy of the ion beam with the electrical input to the beam parallelizer 36 required for parallelizing the ion beam is determined in advance in the ion implantation apparatus 100. The electrical input that is determined in accordance with the setting is provided to the beam parallelizer 36 under the given ion implantation condition (including the target beam energy), and the beam parallelizer 36 is operated. Thus, if the energy of the ion beam that is incident into the beam parallelizer 36 matches the target beam energy, the beam parallelizer 36 can completely parallelize the ion beam as illustrated in FIG. 5A. The focal length of the beam parallelizer 36 is denoted by F0 in FIG. 5A.

If the energy of the ion beam is different from the target beam energy, the beam parallelizer 36 cannot completely parallelize the ion beam under the setting corresponding to the target beam energy.

Figure 5B:
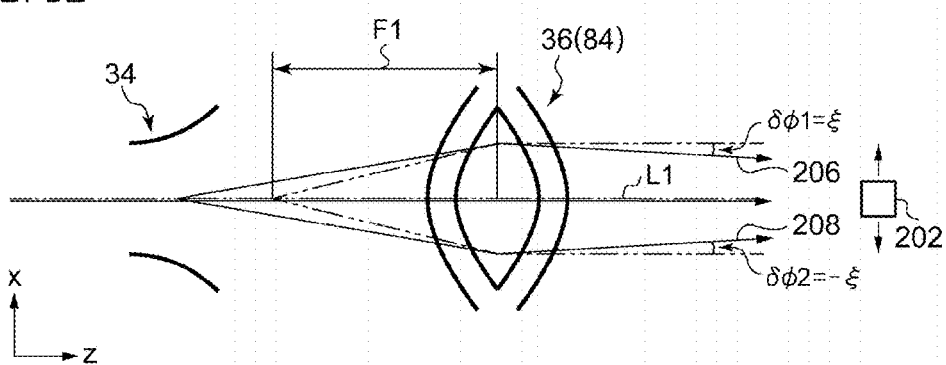
Figure 5C:
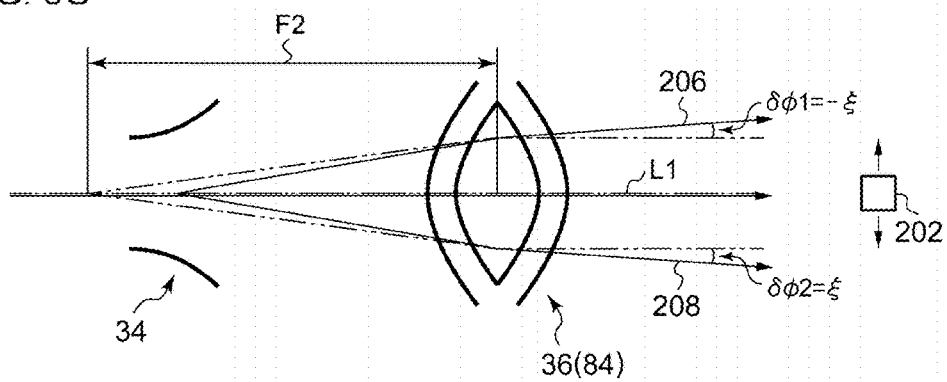

For example, in a case where the energy of the ion beam is lower than the target beam energy, the beam parallelizer 36 causes the ion beam to converge or be deflected excessively, and the beam parallelism deviates from the complete parallelism. This case is equivalent to the case of decreasing the focal length by setting the focal point F of the beam parallelizer 36 to be close to the beam parallelizer 36 as illustrated in FIG. 5B (F1<F0). In a case where the energy of the ion beam is higher than the target beam energy, the beam parallelizer 36 does not cause the ion beam to converge or be deflected sufficiently (the beam diverges), and the beam parallelism deviates from the complete parallelism. This case is equivalent to the case of increasing the focal length by setting the focal point F of the beam parallelizer 36 to be away from the beam parallelizer 36 as illustrated in FIG. 5C (F2>F0).

The relationship between the energy difference and the deviation in parallelism can be acquired by calculating the electric field around the parallelizing lens 84 and calculating the trajectory of the ion beam. It is assumed that the focal length is increased by a factor of $\beta$ when the energy is increased by a factor of $\alpha$. For a certain value of $\alpha$, exiting angles from the parallelizing lens 84 that respectively correspond to some scanning angles within the scanning range of the beam scanner 34 can be calculated. The focal length rate $\beta$ that corresponds to the energy rate $\alpha$ can be acquired from the scanning angles (that is, the incidence angles into the parallelizing lens 84) and the exiting angles from the parallelizing lens 84. By acquiring the focal length rate $\beta$ corresponding to each of a plurality of values of the energy rate $\alpha$, the relationship between the energy rate $\alpha$ and the focal length rate $\beta$ can be acquired. According to the view of the present inventors, the energy rate $\alpha$ and the focal length rate $\beta$ have a linear relationship, that is, $\alpha = A \cdot \beta + B$ (A and B are constants). This relationship does not depend on the scanning angle. The focal length rate $\beta$ corresponds to the deviation in parallelism. Thus, the energy rate $\alpha$ can be calculated by measuring the parallelism.

For example, it is assumed that when the deflection angle (that is, the difference between the incidence angle and the exiting angle) of the ion beam having a target beam energy E0 and passing through the parallelizing lens 84 is denoted by $\Phi$, the actual deflection angle is $\Phi + \delta\Phi$. If it is assumed that the center of the ion beam matches the beam trajectory L1 as an ideal case, the angular difference $\delta\Phi$ can be used as the beam parallelism. The angular difference $\delta\Phi$ is proportional to the energy difference $\delta E$. That is, $\delta E = E0 \times (\delta\Phi/\Phi)$ is established. The energy calculating unit 204 converts the measured beam parallelism (that is, the angular difference $\delta\Phi$) into the energy difference amount $\delta E$ in accordance with such a known relationship.

The parallelizing lens 84 is accurately designed in advance to realize the deflection angle $\Phi$ for parallelizing the ion beam having the target energy E0. The parallelism is one of important parameters in the implantation process. Thus, the parallelism measuring unit 202 is configured to accurately measure the parallelism (that is, $\delta\Phi$). The target energy E0 is determined as a specification of the performed implantation process. Accordingly, the beam energy measuring device 200 can accurately acquire the energy difference amount $\delta E$, that is, the energy E0+$\delta E$ of the ion beam.

A specific example related to measurement of the beam parallelism will be described with reference to FIG. 5B and FIG. 5C. The parallelism measuring unit 202 measures the beam angle related to a direction perpendicular to the reference beam trajectory (x direction) in a plurality of beam portions of the ion beam. The beam parallelism $\delta\Phi$ is defined by using the difference between a beam angle $\delta\Phi 1$ of a first beam portion 206 of the plurality of beam portions and a beam angle $\delta\Phi 2$ of a second beam portion 208 of the plurality of beam portions. For example, the beam parallelism $\delta\Phi$ is defined as $\delta\Phi = (\delta\Phi 1 - \delta\Phi 2)/2$.

The first beam portion 206 is positioned at an edge portion of the ion beam in the x direction. The second beam portion 208 is positioned at an edge portion of the ion beam on the opposite side of the first beam portion 206 in the x direction. The second beam portion 208 and the first beam portion 206 are symmetric with respect to the beam trajectory L1. The interval between measurement points is desirably as large as possible in the x direction. The reason is because measurement points separated largely lead to a large angular difference in a case where the ion beam converges or diverges at the beam parallelizer 36. Thus, measurement sensitivity is improved.

FIG. 5B and FIG. 5C illustrate a case where the center of the ion beam matches the beam trajectory L1 while the energy of the ion beam is different from the target beam energy. As illustrated in FIG. 5B, $\delta\Phi = (\xi - (-\xi))/2 = \xi$ is established when $\delta\Phi 1 = -\delta\Phi 2 = \xi$ is established. As illustrated in FIG. 5C, $\delta\Phi = (-\xi - \xi)/2 = -\xi$ is established when $\delta\Phi 2 = -\delta\Phi 1 = \xi$ is established. The acquired beam parallelism $\delta\Phi$ is converted into the energy difference $\delta E$, and the energy of the ion beam can be acquired by using the energy difference $\delta E$.

Figure 6:
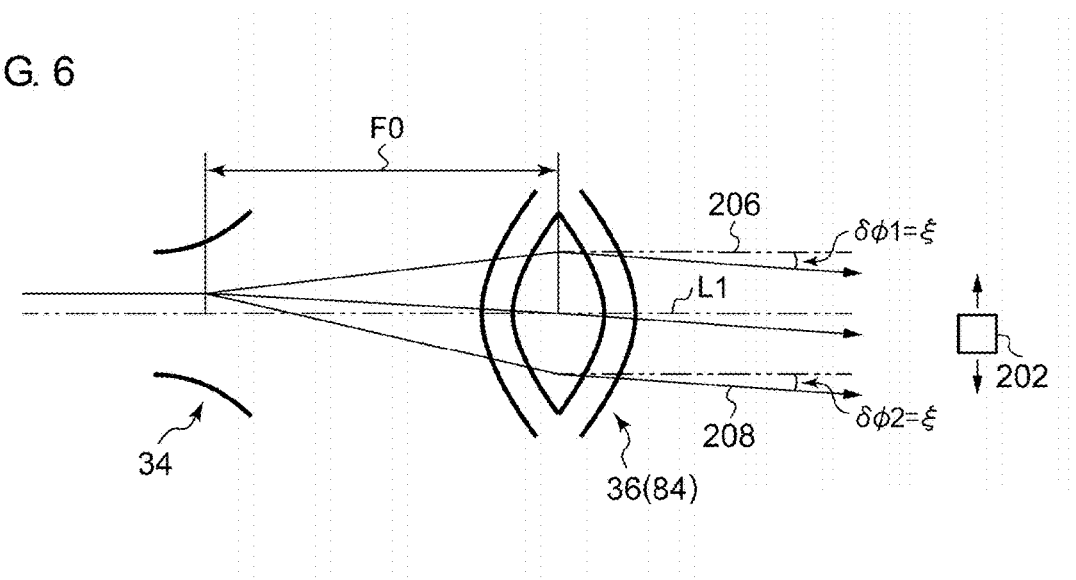
FIG. 6 is a diagram for describing measurement of the beam parallelism.

FIG. 6 illustrates a case where the energy of the ion beam matches the target beam energy while the center of the ion beam deviates from the beam trajectory L1. As illustrated in FIGS. 6, $\delta\Phi = (\xi - \xi)/2 = 0$ is established when $\delta\Phi 1 = \delta\Phi 2 = \xi$ established. Since the beam parallelism $\delta\Phi$ is equal to zero, the energy difference $\delta E$ is also equal to zero. That is, there is no energy difference in both of the first beam portion 206 and the second beam portion 208, and the energy of the ion beam matches the target beam energy.

Since the beam parallelism $\delta\Phi$ is equal to zero, the first beam portion 206 and the second beam portion 208 are parallelized by the beam parallelizer 36. However, as is understood from FIG. 6, the ion beam deviates from the beam trajectory L1 upstream of the beam parallelizer 36. Thus, the first beam portion 206 and the second beam portion 208 deviate (incline) from the designed beam trajectory downstream of the beam parallelizer 36.

A quantity that is defined as the beam angle at one measurement point can also be used as the beam parallelism. However, in this case, when the ion beam deviates from the beam trajectory L1 as illustrated in FIG. 6, the measured beam angle includes an error that is caused by such deviation in trajectory. Consequently, an inaccurate beam parallelism is acquired, and an inaccurate energy difference is acquired from the inaccurate beam parallelism.

If a quantity defined as the difference in beam angle between two measurement points is used as the beam parallelism as illustrated in FIG. 5B and FIG. 5C, the error caused by deviation in trajectory can be excluded. The error caused by deviation in trajectory is common in local portions of the ion beam. In other words, deviation in trajectory that is generated upstream of the beam parallelizer 36 causes the same angular difference in any beam portion downstream of the beam parallelizer 36. Thus, by finding the difference in two measured beam angles, the error included in one measured beam angle can be canceled with the error included in the other measured beam angle. A relative angular difference between beam portions can be accurately found.

Figure 7B:
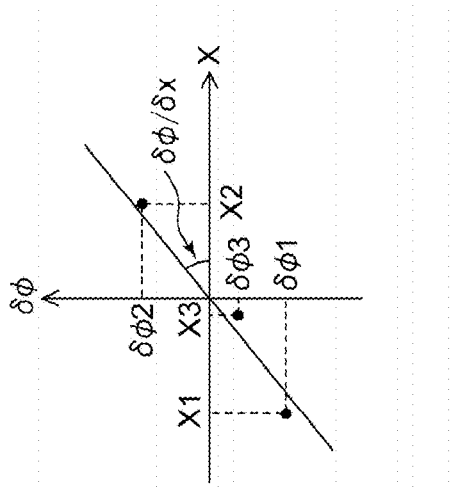
FIG. 7A and FIG. 7B are diagrams for describing measurement of the beam parallelism.
Figure 7A:
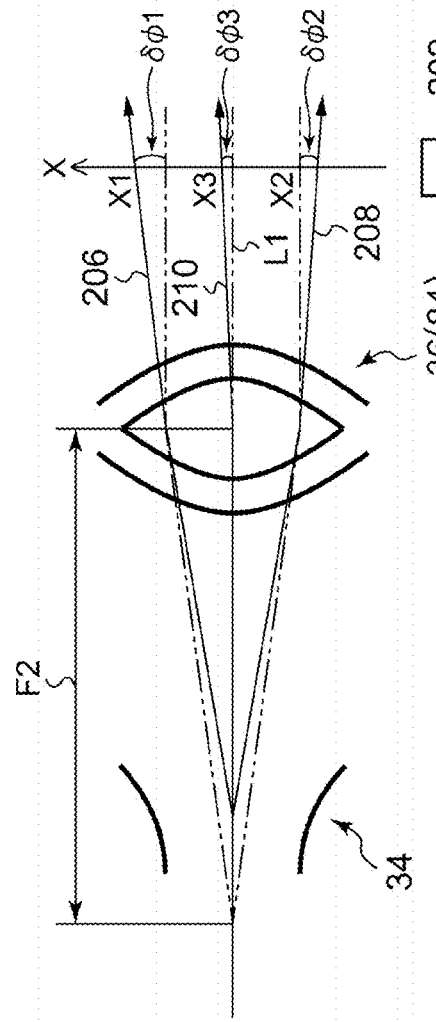

The number of measurement points of the beam angle may be three or more. The parallelism measuring unit 202 may measure the first beam portion 206, the second beam portion 208, and a third beam portion 210. As illustrated in FIG. 7A, the first beam portion 206 and the second beam portion 208 are on the opposite side of each other in the x direction as described above. The third beam portion 210 may be in the vicinity of the center of the scanned ion beam. The x-direction positions of the first beam portion 206, the second beam portion 208, and the third beam portion 210 measured by the parallelism measuring unit 202 are respectively denoted by X1, X2, and X3.

The parallelism measuring unit 202 generates an error distribution of the x-direction beam angle with respect to the x-direction position based on three measured beam angles $\delta\Phi1$, $\delta\Phi2$, and $\delta\Phi3$. The error distribution is acquired by using any well-known method (for example, the least squares method). The error distribution is illustrated in FIG. 7B. The beam parallelism can be defined by using the ratio of the change d ($\delta\Phi$) in x-direction beam angle to a change dx in x-direction position in the error distribution. For example, the beam parallelism may be defined as the ratio d ($\delta\Phi$)/dx. That is, the beam parallelism is an angular difference per unit length in the x direction, and is the inclination of the error distribution.

If the ion beam deviates in trajectory, all of the three measured beam angles $\delta\Phi1$, $\delta\Phi2$, and $\delta\Phi3$ are either increased or decreased according to the amount of the deviation. This case corresponds to a translation of the error distribution illustrated in FIG. 7B. That is, the inclination of the error distribution is not changed. Thus, the error caused by deviation in trajectory can be excluded from the beam parallelism by defining the beam parallelism using the ratio d ($\delta\Phi$)/dx.

Such an error distribution may also be generated in a case where the number of measurement points of the beam angle is two. In this case, the ratio d ($\delta\Phi$)/dx may be calculated from the measured x-direction positions of the two beam portions and the corresponding measured values of the x-direction beam angles.

As described with reference to FIG. 2, the ion implantation apparatus 100 includes the high energy multistage linear acceleration unit 14, the energy analyzing magnet 24, and the energy resolving slit 28. Acceleration performed by the high energy multistage linear acceleration unit 14 basically causes the ion beam to have an energy distribution. The ion implantation apparatus 100 is designed such that the center of the energy distribution corresponds to the center of the slit in a case where the high energy multistage linear acceleration unit 14 is operated with an appropriate parameter. The beam energy becomes equal to the target beam energy after the beam passes through the slit.

In a case where the high energy multistage linear acceleration unit 14 is operated with a parameter that is slightly different from the appropriate parameter, the energy of the ion beam is slightly increased or decreased due to the difference in parameter. Accordingly, the deflection angle of the ion beam caused by the energy analyzing magnet 24 is changed, and the center of the energy distribution of the ion beam does not correspond to the center of the energy resolving slit 28. If the center of the beam deviates from the center of the slit, the beam energy consequently deviates from the target beam energy after the beam passes through the slit.

Therefore, the measured energy of the ion beam may be used for controlling the high energy multistage linear acceleration unit 14. For example, the control device 50 may control the high energy multistage linear acceleration unit 14 based on the calculated energy of the ion beam such that the ion beam has the target energy.

In this case, the control device 50 may control the voltage amplitude V [kV] in at least one high-frequency resonator 14a. Control of the voltage corresponds to direct adjustment of the energy of the ion beam. The at least one high-frequency resonator 14a preferably includes the last stage of the high-frequency resonators. The energy of the ion beam can be easily adjusted by controlling the voltage in the last stage of the high-frequency resonators.

Alternatively, the control device 50 may control the phase $\varphi$ [deg] of the high-frequency power in at least one high-frequency resonator 14a. The proportion of energy that the beam receives when being accelerated can be changed by adjusting the phase.

Accordingly, the beam energy can be accurately adjusted. Thus, for example, the depth of implanted ions into a substrate W can be accurately controlled.

The beam energy measuring device 200 is required to measure a calibration ion beam having a known energy so as to calibrate the beam energy measuring device 200. In a case where the beam energy measuring device 200 is applied to the high energy ion implanter, the beam energy measuring device 200 is desirably calibrated across the entire range of the implantation energy (that is, from a low energy to a high energy).

A correspondence relation between the measured energy and the known energy (hereinafter, referred to as an energy calibration table) is used for calibration in actual beam energy measurement performed by the beam energy measuring device 200. By using the energy calibration table, the measurement result of an ion beam having an unknown energy can be corrected.

However, it is not easy to produce a calibration ion beam having a known "high" energy. For example, the ion beam that is subjected to high-frequency acceleration has a high energy but basically, also has an energy width as described above. Thus, while the magnitude of the energy of the ion beam subjected to high-frequency acceleration can be specified by using resolution corresponding to the energy width, it is difficult to accurately specify the magnitude of the energy of the ion beam. This acts as a constraint on improving the accuracy of calibration. The calibration ion beam should not have an energy width for more accurate calibration. Thus, it is difficult to say that the ion beam subjected to high-frequency acceleration is appropriate as the calibration ion beam.

Therefore, an ion beam that is accelerated with a direct current voltage without being subjected to high-frequency acceleration, that is, a so-called direct current beam (hereinafter, referred to as a DC beam), is considered to be used as the calibration ion beam. Since high-frequency acceleration is not performed, the ion beam is accelerated with only the extraction voltage. Thus, the energy of the DC beam has a magnitude corresponding to the extraction voltage (that is, the DC beam has a known energy). The DC beam does not have an energy width unlike the ion beam subjected to high-frequency acceleration. In other words, the DC beam is monochromatic in terms of energy. The magnitude of the energy of the DC beam can be more accurately specified than the ion beam subjected to high-frequency acceleration. Thus, the DC beam is appropriate as the calibration ion beam.

However, the maximum value of the energy that the DC beam may have is constrained by the upper limit of the extraction voltage. The maximum extraction voltage is typically approximately 100 kV. Thus, the maximum value of the energy of the DC beam having a monovalent ion is approximately 100 keV. The extent to which the energy of the calibration ion beam can be increased is limited. While the latest high energy ion implanter enables ion implantation in an ultra high energy region, for example, higher than or equal to 1 MeV by using high-frequency acceleration, the energy of the calibration ion beam does not reach such an ultra high energy.

From such circumstances, it is also considered that a method of extrapolating the calibration result in the low energy region to the high energy region is used instead of performing calibration by actually using the ion beam having a known "high" energy. However, since this method uses extrapolation, error may be increased as the energy becomes higher. If the calibration result in the low energy region that is acquired by using an easily usable calibration ion beam, for example, less than or equal to 100 keV is extrapolated to the ultra high energy region, for example, higher than or equal to 1 MeV, errors in the ultra high energy region become a considerable concern.

From such a background, it is desirable to increase the energy of the DC beam. The present inventors suggest generating a DC beam having a multiply charged ion in the ion beam generating unit 12 so as to increase the energy of the DC beam. If a multiply charged ion is generated and extracted from the beam generating unit 12, the beam has an energy corresponding to the extraction voltage multiplied by the charge state of the ion. For example, if a divalent ion is extracted with an extraction voltage of 100 kV, a doubly charged ion beam having an energy of 200 keV is acquired. If a tetravalent ion is extracted with an extraction voltage of 100 kV, a quadruply charged ion beam having an energy of 400 keV is acquired.

A part of the multiply charged ion beam receives electrons from residual gas in the beamline by interaction or the like while being transferred through the beamline. Consequently, the part of the multiply charged ion beam has a decrease in charge state while maintaining the original high energy thereof, and finally becomes a monovalent ion beam having the high energy. In the above example, a monovalent ion beam of 200 keV is acquired from the doubly charged ion beam. Alternatively, a monovalent ion beam of 400 keV is acquired from the quadruply charged ion beam.

The electrostatic deflection effect caused by the parallelizing lens 84 or other beamline constituents is determined by the energy of the ion per charge state. A monovalent ion of 100 keV and a quadruply charged ion of 400 keV have the equal energy of 100 keV per charge state and thus, have the same degree of electrostatic deflection (for example, the deflection angle). The energy per charge state is increased by decreasing the charge state of the ion. A singly charged ion of 400 keV has an energy per charge state that is four times higher than the energy per charge state of a singly charged ion of 100 keV.

Thus, the energy per charge state of the ion beam is increased by decreasing the charge state of the ion beam in the beam energy measuring device 200 that uses the beam parallelizer 36. Using such a calibration ion beam having a high energy per charge state can improve the accuracy of calibration of the beam energy measuring device 200.

Promoting a decrease in the charge state of the multiply charged ion beam in producing the energy calibration table leads to an increase in the efficiency of the production work such as a decrease in the time period of the work. For example, a decrease in the charge state may be prompted if a beamline pressure during production of the energy calibration table is increased further than the beamline pressure in the ion implantation process. Accordingly, the interaction between the residual gas and the multiply charged ion prompts a decrease in the charge state of the multiply charged ion, and a singly charged ion beam having the original high energy can be efficiently generated.

Figure 8:
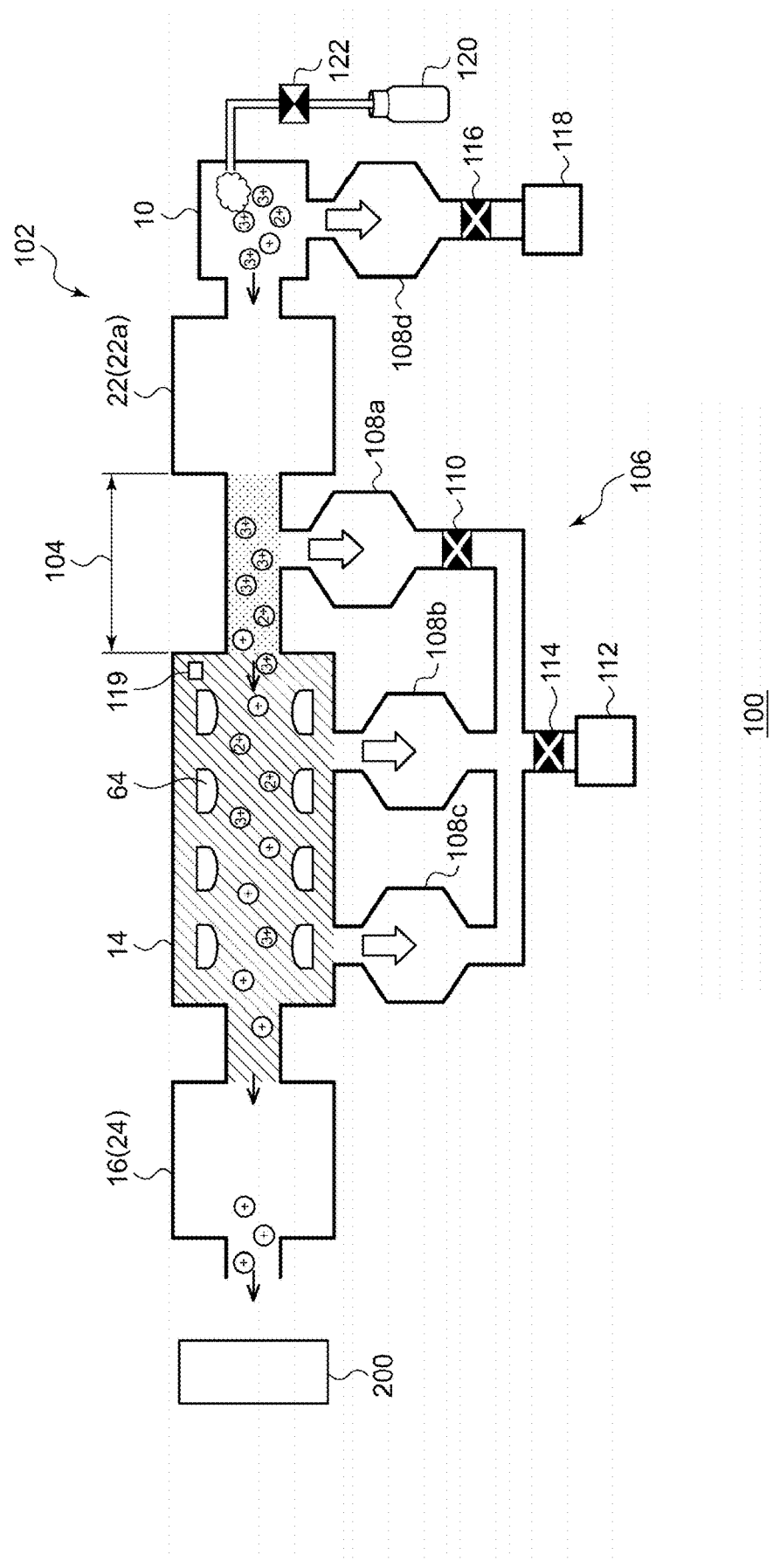
FIG. 8 is a diagram schematically illustrating an upstream beamline of the ion implantation apparatus according to the embodiment of the present invention.

FIG. 8 schematically illustrates an upstream beamline 102 of the ion implantation apparatus 100 according to the embodiment of the present invention. The upstream beamline 102 refers to the part between the ion source 10 and the beam deflecting unit 16 of the ion implantation apparatus 100. The upstream beamline 102 is disposed downstream of the ion source 10 and includes the mass analyzer 22 (for example, the mass analyzing magnet 22a) and the high energy multistage linear acceleration unit 14. FIG. 8 illustrates some of the focusing and defocusing lenses 64 of the high energy multistage linear acceleration unit 14 and does not illustrate the high-frequency resonators 14a. The energy analyzing magnet 24 is disposed downstream of the upstream beamline 102. The beam energy measuring device 200 measures the energy of the calibration ion beam downstream of the energy analyzing magnet 24.

The beam generating unit 12 can generate the calibration ion beam that includes a multiply charged ion having a known energy corresponding to the extraction voltage. The ion source 10 can generate a multiply charged ion of boron, phosphorus, arsenic, argon, xenon, or nitrogen. An element for which a cation having a charge state such as triply charged, quadruply charged, or the like is easily generated is useful for generating the calibration ion beam having a high energy. The charge state of ion species having a large electron capture cross section (that is, a high capability of receiving electrons) is easily decreased. Thus, such ion species are also useful. From such a viewpoint, argon or arsenic is particularly useful.

The upstream beamline 102 includes a beamline section from the outlet of the mass analyzing magnet 22a to the inlet of the high energy multistage linear acceleration unit 14. Hereinafter, the beamline section will be referred to as a connecting vacuum chamber 104. The connecting vacuum chamber 104 connects the outlet of the mass analyzing magnet 22a to the inlet of the high energy multistage linear acceleration unit 14. For example, the connecting vacuum chamber 104 is a vacuum chamber that is configured with a metal casing. Alternatively, the mass analyzer 22 may be connected with the high energy multistage linear acceleration unit 14 by using a bellows. In this case, the connecting vacuum chamber 104 includes the bellows. An electric field device or a magnetic field device that acts on the ion beam is not disposed in the connecting vacuum chamber 104.

An upstream beamline pressure adjusting device 106 is disposed with the upstream beamline 102. The upstream beamline pressure adjusting device 106 constitutes apart of an evacuating system of the ion implantation apparatus 100. The upstream beamline pressure adjusting device 106 is connected to the upstream beamline 102 so as to adjust the pressure of the upstream beamline 102.

The upstream beamline pressure adjusting device 106 includes at least one high vacuum pump, for example, a turbomolecular pump. Three turbomolecular pumps are disposed in the upstream beamline 102.

A first turbomolecular pump 108a is disposed with the mass analyzer 22. The first turbomolecular pump 108a mainly adjusts the pressure of the beamline section from the outlet of the mass analyzing magnet 22a to the inlet of the high energy multistage linear acceleration unit 14. A vacuum evacuating port of the first turbomolecular pump 108a is connected to the connecting vacuum chamber 104 in the configuration illustrated in FIG. 8. Alternatively, the vacuum evacuating port of the first turbomolecular pump 108a may be connected to the mass analyzing magnet 22a. A first gate valve 110 is disposed at an exhausting port of the first turbomolecular pump 108a.

The second turbomolecular pump 108b and the third turbomolecular pump 108c are disposed with the high energy multistage linear acceleration unit 14. The second turbomolecular pump 108b is disposed on the upstream side, and the third turbomolecular pump 108c is disposed on the downstream side. Thus, the second turbomolecular pump 108b adjusts the pressure on the upstream side of the high energy multistage linear acceleration unit 14 (for example, the first linear accelerator 15a illustrated in FIG. 1). The third turbomolecular pump 108c adjusts the pressure on the downstream side of the high energy multistage linear acceleration unit 14 (for example, the second linear accelerator 15b illustrated in FIG. 1).

The exhausting port of each of the first turbomolecular pump 108a, the second turbomolecular pump 108b, and the third turbomolecular pump 108c is connected to a roughing pump 112 via a second gate valve 114. The first gate valve 110 is disposed between the first turbomolecular pump 108a and the second gate valve 114.

A fourth turbomolecular pump 108d is disposed in the ion source 10. An exhausting port of the fourth turbomolecular pump 108d is connected to a roughing pump 118 via a third gate valve 116. The fourth turbomolecular pump 108d adjusts the pressure of the ion source 10. A gas supplying unit 120 that supplies gas as a source material of ion is connected to the ion source 10 via a flow rate adjusting unit (for example, a mass flow controller) 122.

The upstream beamline pressure adjusting device 106 may include a vacuum gauge 119. The vacuum gauge 119 is disposed in any location in the upstream beamline 102, for example, at the inlet or in the vicinity of the inlet of the high energy multistage linear acceleration unit 14. The vacuum gauge 119 measures the pressure of the upstream beamline 102, for example, the pressure of the connecting vacuum chamber 104.

Figure 9:
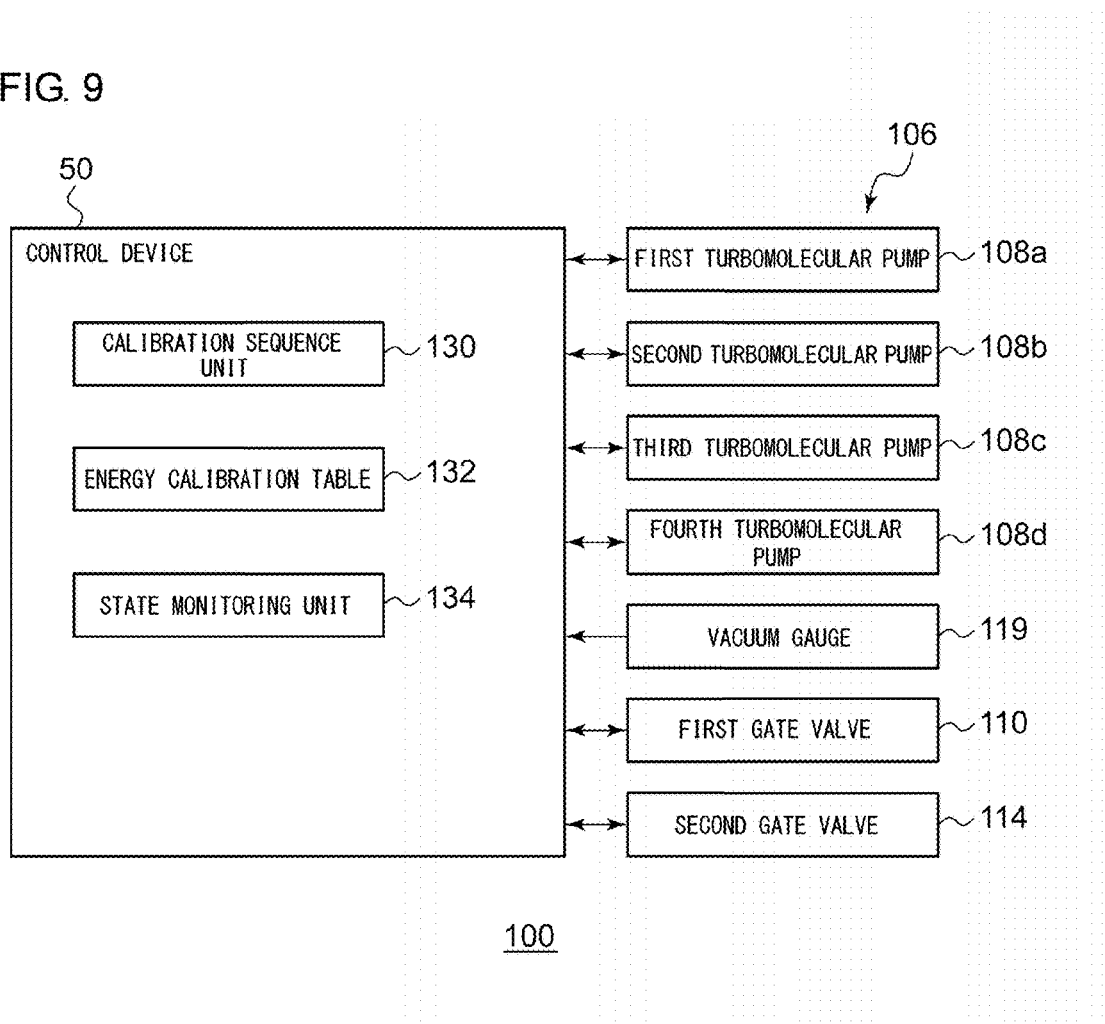
FIG. 9 is a block diagram illustrating a schematic configuration of a control device of the ion implantation apparatus according to the embodiment of the present invention.

FIG. 9 is a block diagram illustrating a schematic configuration of the control device 50 of the ion implantation apparatus 100 according to the embodiment of the present invention. The control device 50 includes a calibration sequence unit 130, an energy calibration table 132, and a state monitoring unit 134. The control device 50 is configured to control each constituent of the upstream beamline pressure adjusting device 106 such as the first turbomolecular pump 108a and the first gate valve 110. The control device 50 receives the measured pressure from the vacuum gauge 119.

The upstream beamline pressure adjusting device 106 adjusts the pressure of the upstream beamline 102 under control of the control device 50. The upstream beamline pressure adjusting device 106 adjusts the pressure of the upstream beamline 102 to a first pressure during the ion implantation process. The first pressure is a pressure that is appropriate for transferring the implantation ion beam used in the ion implantation process. For example, the first pressure is selected from a range of $10^{-5}$ Pa to $10^{-4}$ Pa. During the ion implantation process, the first turbomolecular pump 108a, the second turbomolecular pump 108b, the third turbomolecular pump 108c, and the roughing pump 112 are operated, and the first gate valve 110 and the second gate valve 114 are open.

The calibration sequence unit 130 produces the energy calibration table 132 in accordance with a calibration sequence that is determined in advance. The energy calibration table 132 represents a correspondence relation between the known energy of the calibration ion beam and the energy of the calibration ion beam measured by the beam energy measuring device 200.

The calibration sequence unit 130 controls the upstream beamline pressure adjusting device 106 to adjust the pressure of the upstream beamline 102 to a second pressure while producing the energy calibration table 132. The second pressure is higher than the first pressure. The second pressure is selected from a pressure range that enables transfer of the calibration ion beam, for example, a range of $10^{-4}$ Pa to $10^{-2}$ Pa. For example, the second pressure may be $10^{-3}$ Pa. Accordingly, the pressure of the beamline can be increased in the section between the mass analyzing magnet 22a and the energy analyzing magnet 24 while the energy calibration table 132 is produced.

The calibration sequence unit 130 controls the upstream beamline pressure adjusting device 106 to adjust the pressure of at least the connecting vacuum chamber 104 to the second pressure while producing the energy calibration table 132. The calibration sequence unit 130 stops the first turbomolecular pump 108a and closes the first gate valve 110 while producing the energy calibration table 132.

The calibration sequence unit 130 may control the upstream beamline pressure adjusting device 106 to adjust the pressure of the high energy multistage linear acceleration unit 14 to the second pressure while producing the energy calibration table 132. The calibration sequence unit 130 may stop at least one of the second turbomolecular pump 108b and the third turbomolecular pump 108c (along with the first turbomolecular pump 108a or instead of the first turbomolecular pump 108a) while producing the energy calibration table 132.

The calibration sequence unit 130 controls the high energy multistage linear acceleration unit 14 while producing the energy calibration table 132, such that the high energy multistage linear acceleration unit 14 transfers the calibration ion beam without performing high-frequency acceleration of the calibration ion beam. The calibration sequence unit 130 does not operate the high-frequency resonators 14a and operates only the focusing and defocusing lenses 64. Accordingly, the high energy multistage linear acceleration unit 14 is used for transferring the DC beam.

Figure 10:
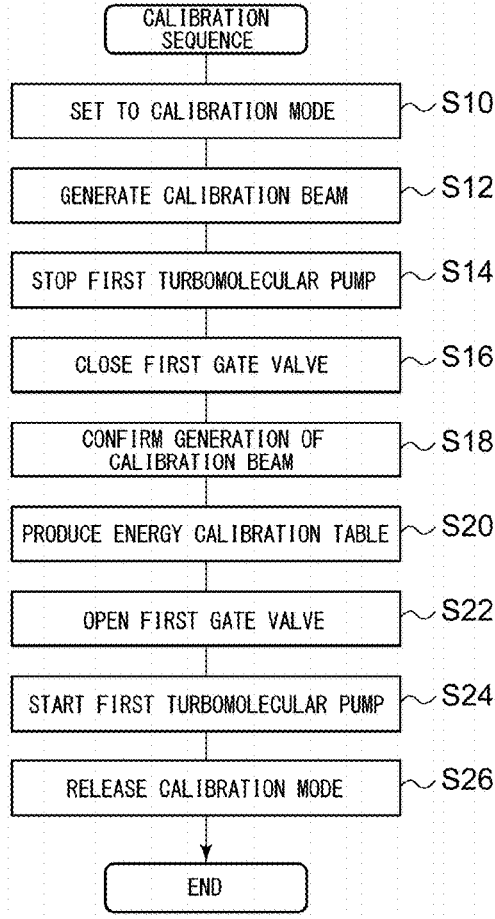
FIG. 10 is a flowchart illustrating a calibration sequence according to the embodiment.

FIG. 10 is a flowchart illustrating the calibration sequence according to the embodiment. The calibration sequence is executed by the calibration sequence unit 130. First, the operator provides an input to set the ion implantation apparatus 100 to a calibration mode, and the calibration sequence is started (S10). The ion implantation apparatus 100 generates the calibration ion beam (S12).

The calibration sequence unit 130 includes an operating parameter dedicated to the calibration mode (hereinafter, referred to as a calibration operating parameter) for each constituent of the ion implantation apparatus 100. The calibration sequence unit 130 switches the operating parameter of each constituent to the calibration operating parameter at the start of the calibration sequence.

The calibration operating parameter for the ion source 10 is determined to efficiently generate a multiply charged ion. Thus, the calibration ion beam that includes a multiply charged ion having a known energy corresponding to the extraction voltage is extracted from the ion source 10. The ion source 10 can generate the calibration ion beam that includes a multiply charged ion having a first charge state. The calibration operating parameter for the mass analyzer 22 is determined to generate a magnetic field that selects the multiply charged ion having the first charge state.

The calibration operating parameter for the high energy multistage linear acceleration unit 14 is determined to efficiently transfer the calibration ion beam that includes a singly charged ion or a multiply charged ion having a second charge state. The second charge state is less than the first charge state. In other words, the calibration operating parameter of the high energy multistage linear acceleration unit 14 is determined to efficiently transfer the calibration ion beam of which the charge state is decreased from the charge state of the original multiply charged ion (for example, to the singly charged ion). The calibration operating parameter of the high energy multistage linear acceleration unit 14 is determined such that the high energy multistage linear acceleration unit 14 does not perform high-frequency acceleration as described above.

The calibration operating parameter for the energy analyzing magnet 24 is determined to generate a magnetic field that selects the calibration ion beam including the singly charged ion or the multiply charged ion having the second charge state. The calibration operating parameters for the steering magnet 30 and other beamline constituents disposed downstream of the energy analyzing magnet 24 are also determined to transfer, as much as possible, the calibration ion beam including the singly charged ion or the multiply charged ion having the second charge state.

Next, the calibration sequence unit 130 stops the first turbomolecular pump 108a (S14), and closes the first gate valve 110 (S16). Evacuating operations of the second turbomolecular pump 108b and the third turbomolecular pump 108c are continued. Operation of the roughing pump 112 is continued, and the second gate valve 114 is open. Consequently, the pressure of the connecting vacuum chamber 104 is increased from the first pressure to the second pressure. The calibration sequence unit 130 may reference the pressure measured by the vacuum gauge 119 to confirm that the pressure of the connecting vacuum chamber 104 is adjusted to the second pressure.

Next, the calibration sequence unit 130 confirms that the calibration ion beam is generated (S18). The calibration sequence unit 130 confirms that the calibration ion beam of which the charge state is decreased from the charge state of the original multiply charged ion (for example, to the singly charged ion) is generated, by using the beam current detector (for example, the second beam measurer 80b, the third beam measurer 80c, or the beam energy measuring device 200) that is disposed downstream of the energy analyzing magnet 24. Appropriate operation of each constituent of the ion implantation apparatus 100 should indicate that the calibration ion beam having a beam current sufficient for producing the energy calibration table 132 is generated. In a case where generation of the sufficient calibration ion beam is not confirmed, a malfunction or the like of the apparatus is expected, and the calibration sequence unit 130 may stop the calibration sequence.

In a case where the calibration ion beam is generated, the calibration sequence unit 130 produces the energy calibration table 132 (S20). The calibration sequence unit 130 associates the energy of the calibration ion beam measured by the beam energy measuring device 200 with the known energy of the calibration ion beam (a value corresponding to the extraction voltage). Accordingly, one calibration point of the energy calibration table 132 is acquired.

The calibration sequence unit 130 may generate a plurality of different types of calibration ion beams in order and acquire the calibration point for each type of calibration ion beam so as to acquire a plurality of calibration points. For example, the calibration sequence unit 130 can generate the calibration ion beams in order under a plurality of different types of ion beam generating conditions (for example, a plurality of different extraction voltages, a plurality of different charge states, and a plurality of different ion species). If all required calibration points are acquired, the production of the energy calibration table 132 is finished. The produced energy calibration table 132 is stored in the control device 50 or a storage device (for example, the parameter storage device 70 illustrated in FIG. 3) included in the control device 50.

When the production of the energy calibration table 132 is finished, the calibration sequence unit 130 opens the first gate valve 110 (S22), and starts the first turbomolecular pump 108a (S24). Then, the calibration sequence unit 130 releases the calibration mode (S26). Accordingly, the calibration sequence is finished.

Before the calibration sequence unit 130 releases the calibration mode, the calibration sequence unit 103 may confirm that the pressure of the upstream beamline 102 is restored to the first pressure, by referencing the pressure measured by the vacuum gauge 119. The calibration sequence unit 130 may switch the calibration operating parameter to the original operating parameter (that is, the operating parameter before the start of the calibration sequence) for each constituent of the ion implantation apparatus 100 when releasing the calibration mode.

With the above configuration, for example, a singly charged calibration ion beam of 270 keV can be generated by using an extraction power supply of 90 kV. First, the operating parameter of the ion source 10 is appropriately set to generate a triply charged arsenic ion as much as possible in the ion source 10. If the triply charged arsenic ion is extracted with an extraction voltage of 90 kV, the triply charged arsenic ion has an energy of 270 keV. The magnetic field of the mass analyzing magnet 22a of the mass analyzer 22 is appropriately set to select the triply charged arsenic ion beam of 270 keV.

The triply charged arsenic ion of 270 keV exiting from the mass analyzer 22 collides with residual gas in the connecting vacuum chamber 104 and receives electrons from the residual gas. If the triply charged arsenic ion of 270 keV receives two electrons, the triply charged arsenic ion of 270 keV is changed to a singly charged arsenic ion of 270 keV. Particles in various states such as the triply charged arsenic ion that does not receive electrons, and a doubly charged ion that receives one electron are also present in the connecting vacuum chamber 104 and the beamline on the downstream side of the connecting vacuum chamber 104. The operating parameter of each focusing and defocusing lens 64 of the high energy multistage linear acceleration unit 14 is appropriately set to transfer the singly charged arsenic ion of 270 keV as much as possible. Since the high-frequency resonators 14a of the high energy multistage linear acceleration unit 14 are not operated, the singly charged arsenic ion of 270 keV is transferred in remaining to have an energy as the DC beam.

The magnetic field of the energy analyzing magnet 24 is appropriately set to select the singly charged arsenic ion beam of 270 keV. The steering magnet 30 and other beamline constituents disposed downstream of the energy analyzing magnet 24 are also appropriately set to transfer the singly charged arsenic ion beam of 270 keV as much as possible. Accordingly, the singly charged arsenic ion beam of 270 keV can reach the beam energy measuring device 200.

If an ion having a charge state other than triply charged is used, a calibration ion beam having a different energy can be generated. Particularly, by using an ion having a higher charge state such as a quadruply charged ion, a calibration ion beam having a higher energy can be generated, and the calibration point can be acquired in a higher energy region. Accordingly, the accuracy of calibration in the high energy region can be improved. In the above example a calibration ion beam of 360 key can be generated by using a quadruply charged ion. If doubly charged ion is used, a calibration ion beam of 180 keV is generated. A calibration ion beam having a different energy can also be generated by changing the extraction voltage.

Figure 11:
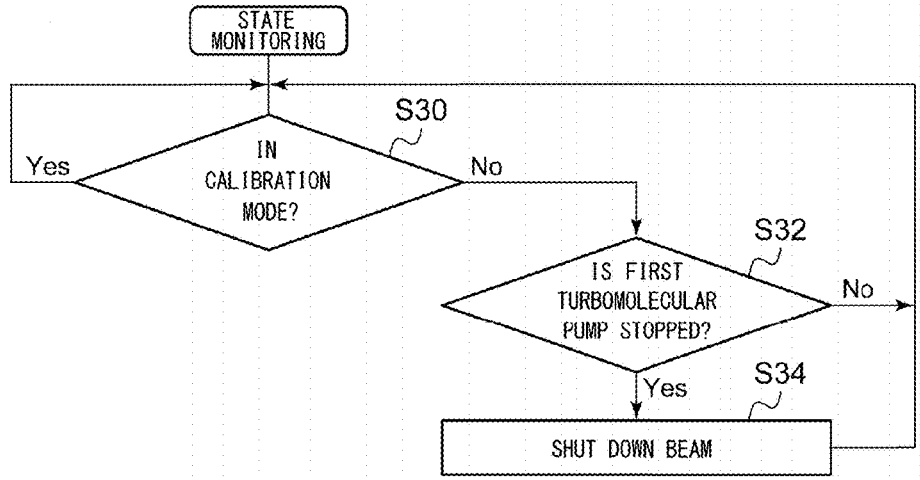
FIG. 11 is a flowchart illustrating operation of a state monitoring unit according to the embodiment.

FIG. 11 is a flowchart illustrating operation of the state monitoring unit 134 according to the embodiment. The state monitoring unit 134 is configured to monitor the operating state of each constituent of the ion implantation apparatus 100. In a case where a malfunction occurs in any constituent of the ion implantation apparatus 100, or where it is expected that any constituent of the ion implantation apparatus 100 has a possibility of a malfunction, the state monitoring unit 134 is configured to perform a safety measure such as stopping or blocking the ion beam.

A state monitoring process illustrated in FIG. 11 is periodically repeated during operation of the ion implantation apparatus 100. If the process is started, the state monitoring unit 134 determines whether or not the current operating mode of the ion implantation apparatus 100 is the calibration mode (S30) as illustrated in FIG. 11. In a case where the current operating mode is the calibration mode (Yes in S30), the state monitoring unit 134 finishes the current state monitoring process.

In a case where the current operating mode is not the calibration mode (for example, in a case where the current operating mode is a typical ion implantation mode) (No in S30), the state monitoring unit 134 determines whether or not the first turbomolecular pump 108a is currently stopped (S32). The state monitoring unit 134 may determine whether or not at least one turbomolecular pump is currently stopped. In a case where the turbomolecular pump is not currently stopped (that is, in a case where the turbomolecular pump is normally operated) (No in S32), the state monitoring unit 134 finishes the current state monitoring process.

In a case where the turbomolecular pump is currently stopped (Yes in S32), the state monitoring unit 134 shuts down the ion beam (S34). For example, a blocking plate that blocks the ion beam is inserted in the beamline. Alternatively, the ion source 10 or other beamline constituents are stopped, and the ion beam is lost in the beamline. The ion implantation apparatus 100 has a function of shutting down the ion beam as one of the safety measures.

The state monitoring process in a typical ion implantation apparatus does not include a determination as to whether or not the current operating mode is the calibration mode. Thus, if the turbomolecular pump is stopped, the ion beam is shut down regardless of the current operating mode of the ion implantation apparatus 100. In this case, if the first turbomolecular pump 108a is stopped as in the calibration sequence illustrated in FIG. 10, the calibration ion beam is also shut down, and the work of producing the energy calibration table 132 cannot be continued.

However, according to the state monitoring process of the present embodiment, the ion beam is not shut down in a case where the current operating mode is the calibration mode. Generation and transfer of the calibration ion beam are continued. Thus, producing the energy calibration table 132 can be completed.

Figure 12:
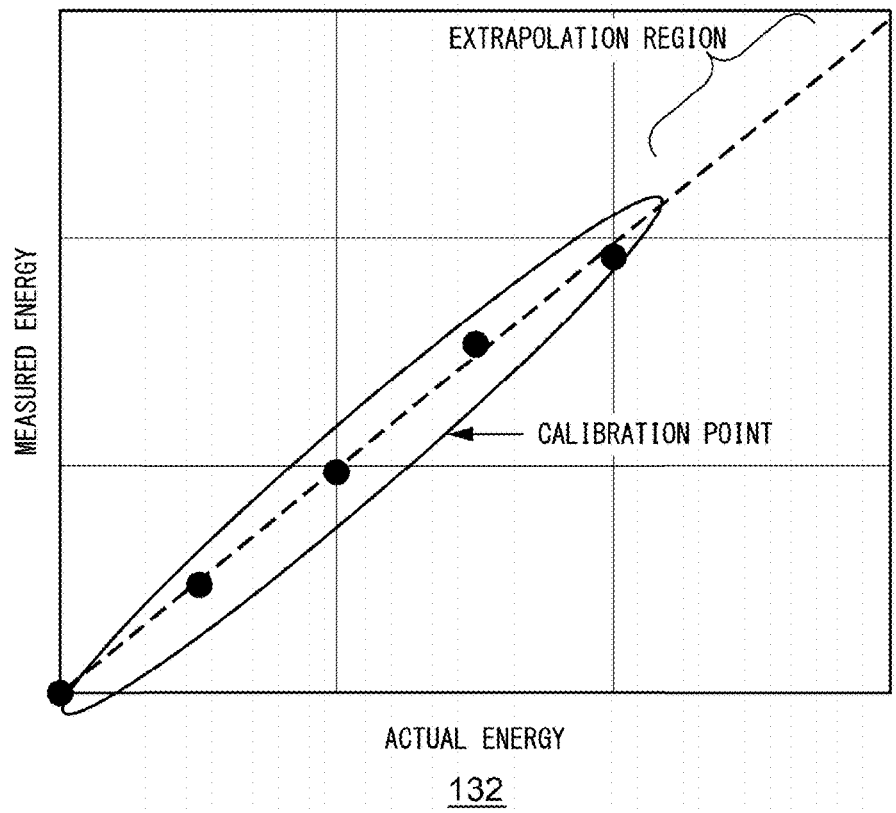
FIG. 12 is a conceptual diagram illustrating an energy calibration table according to the embodiment.

FIG. 12 is a graph illustrating the energy calibration table 132 according to the embodiment. FIG. 12 conceptually illustrates the energy calibration table 132 that is a correspondence relation between the energy measured by the beam energy measuring device 200 (vertical axis) and the actual energy (horizontal axis). The actual energy denoted on the horizontal axis is the energy that is calculated in accordance with the extraction voltage. A plurality of calibration points (five calibration points in the illustrated example) is measured by using the DC beam having a high energy that is acquired by using a decrease in the charge state of the multiply charged ion. The energy calibration table 132 in a predetermined energy range is derived from the calibration points by using an appropriate technique such as fitting calculation with the least squares method. The energy calibration table 132 is generally acquired as a linear calibration line. The measured energy and the actual energy are approximately equal to each other, and both have a proportional relationship of which the proportionality constant is approximately equal to one. The actual energy corresponding to the measured energy is calculated by interpolation between two adjacent calibration points or by extrapolation on the higher energy side than the maximum calibration point.

Figure 13:
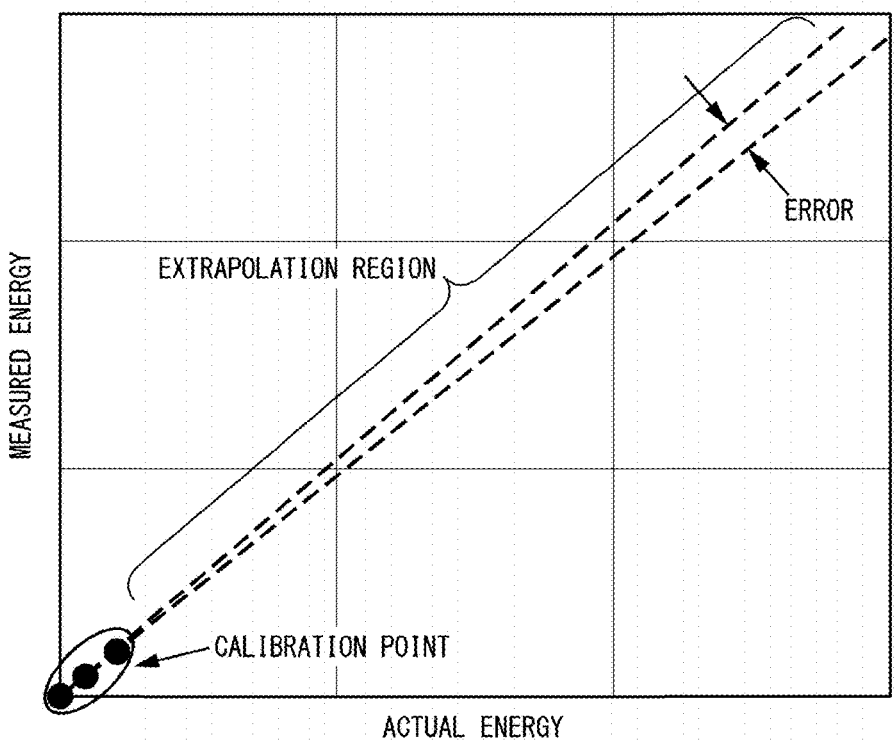
FIG. 13 is a diagram illustrating an energy calibration table according to a comparative example.

FIG. 13 illustrates an energy calibration table according to a comparative example. This energy calibration table is acquired by using a simply extracted DC beam (that is, a DC beam that is acquired without using a decrease in the charge state of the multiply charged ion as described above). Thus, the calibration points have a significantly low energy. Thus, the extrapolation region on the high energy side is wider than the extrapolation region of the energy calibration table 132 illustrated in FIG. 12. If the linear calibration line illustrated in FIG. 13 is extended to the high energy side in the same energy range as the energy calibration table 132 illustrated in FIG. 12, a large error may occur in the high energy region.

According to the present embodiment, the calibration point can be actually acquired in a higher energy region, and the energy calibration table 132 can be more accurately produced. The accuracy of calibration for beam energy measurement in the ion implantation apparatus 100 is improved, and the accuracy of measurement performed by the beam energy measuring device 200 is improved. The energy of the implantation ion beam that includes the ion beam subjected to high-frequency acceleration can be accurately measured. The energy of the beam in the ion implantation process can be accurately adjusted by using the accurate result of beam energy measurement, and ion implantation can be accurately performed such that the depth of implanted ions into the substrate W can be accurately controlled.

According to the present embodiment, the pressure of the upstream beamline 102 during execution of the calibration sequence is adjusted to be higher than the pressure of the upstream beamline 102 during the ion implantation process by using the upstream beamline pressure adjusting device 106. Accordingly, a change in the charge state of the multiply charged ion (specifically, a decrease in charge state) is prompted, and the calibration ion beam having a high energy can be efficiently generated.

The pressure adjustment and the change in the charge state of the multiply charged ion in the present embodiment desirably occur in the most upstream location between the mass analyzer 22 and the energy analyzing magnet 24, for example, the connecting vacuum chamber 104. The reason is because all of the beamline constituents on the downstream side of the mass analyzer 22 such as the high energy multistage linear acceleration unit 14 and the energy analyzing magnet 24 are operated with the calibration operating parameter that is optimized to of transfer the ion beam having the changed charge state. In other words, with the beamline constituents on the downstream side, it is difficult to transfer the original multiply charged ion, and the original multiply charged ion is easily lost. Changing the charge state of the multiply charged ion in the connecting vacuum chamber 104 is effective to generate more ions having the changed charge state.

Such a pressure adjustment is realized in the present embodiment by a comparatively simple operation that is turning the first turbomolecular pump 108a ON or OFF. Such an operation can be performed in a shorter time period than an inconvenient work of temporarily stopping the ion implantation apparatus and restarting the ion implantation apparatus (this work may be required at the start or the end of the calibration work in the related art). Thus, the time period required for the calibration work can be shortened.

Figure 14:
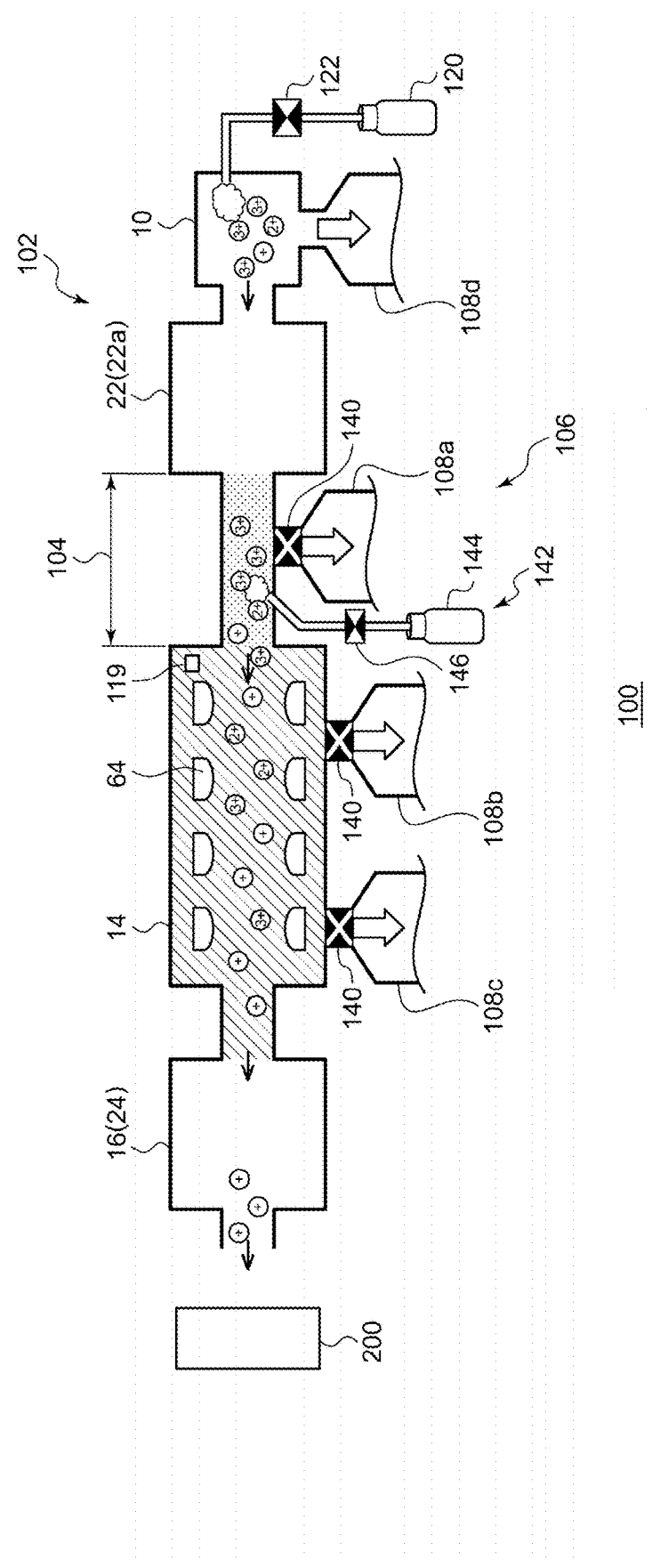
FIG. 14 is a diagram schematically illustrating an upstream beamline of an ion implantation apparatus according to another embodiment.

FIG. 14 is a diagram schematically illustrating the upstream beamline 102 of the ion implantation apparatus 100 according to another embodiment.

As illustrated in FIG. 14, a conductance valve 140 is disposed at the vacuum evacuating port of each of the first turbomolecular pump 108a, the second turbomolecular pump 108b, and the third turbomolecular pump 108c. The conductance valve 140 is set to a first conductance during the ion implantation process. The calibration sequence unit 130 sets the conductance valve 140 to a second conductance lower than the first conductance while producing the energy calibration table 132. Even in this case, the degree of vacuum in the upstream beamline 102 can be lowered, and a change in the charge state of the multiply charged ion can be promoted. The conductance valve 140 maybe disposed in only the first turbomolecular pump 108a.

The upstream beamline pressure adjusting device 106 may include a gas supplying device 142 that is connected to the upstream beamline 102. The gas supplying device 142 is configured to supply gas to, for example, the connecting vacuum chamber 104. However, the gas supplying device 142 may be configured to supply gas to the high energy multistage linear acceleration unit 14. The gas supplying device 142 includes a gas source 144 such as a gas bottle, and a flow rate adjusting unit 146 such as a mass flow controller.

The calibration sequence unit 130 controls the gas supplying device 142 to supply gas to the upstream beamline 102, for example, the connecting vacuum chamber 104, while producing the energy calibration table 132. The calibration sequence unit 130 controls the gas supplying device 142 to adjust the upstream beamline pressure to the second pressure while producing the energy calibration table 132.

The gas supplying device 142 can supply rare gas, nitrogen gas, oxygen gas, or mixed gas containing at least one of rare gas, nitrogen gas, and oxygen gas to the upstream beamline 102. Gas species that has a large ionization cross section (that is, a high capability of discharging electrons) is useful for easily providing electrons to the multiply charged ion supplied from the ion source 10. From such a viewpoint, xenon gas, krypton gas, or mixed gas containing at least one of xenon gas and krypton gas is particularly useful. Even in this case, a change in the charge state of the multiply charged ion in the upstream beamline 102 can be prompted.

The upstream beamline pressure adjusting device 106 may include both of or at least one of the conductance valve 140 and the gas supplying device 142. At least one of the conductance valve 140 and the gas supplying device 142 may be used along with the first turbomolecular pump 108a and the first gate valve 110 described with reference to FIG. 8.

The present invention is described heretofore based on the embodiments. The present invention is not limited to the embodiments, and various design changes can be made. Those skilled in the art should understand that various modification examples can be made, and that those modification examples also fall within the scope of the present invention.

While the ion implantation apparatus 100 includes the electrostatic beam parallelizer 36 in the embodiments, the present invention is not limited thereto. In another embodiment, the ion implantation apparatus 100 may include a magnetic field beam parallelizer. In this case, the energy of the ion beam can be measured in the same manner by replacing the word "voltage" in the description with the word "magnetic field".

The calibration according to the embodiments can also be applied to calibration of an energy measuring device that is used in combination with an electric field or magnetic field deflecting device (for example, the final energy filter 38). The electric field or magnetic field deflecting device is disposed on the downstream side of the mass analyzer 22 and the energy analyzing magnet 24. The energy measuring device measures the energy of the ion beam based on the deflection angle of the ion beam caused by the deflecting device.

Embodiments of the present invention can also be represented as follows.

1. An ion implantation apparatus including an ion source that is capable of generating a calibration ion beam including a multiply charged ion which has a known energy corresponding to an extraction voltage, an upstream beamline that is disposed downstream of the ion source and includes a mass analyzing magnet and a high-frequency linear accelerator, an energy analyzing magnet that is disposed downstream of the upstream beamline, a beam energy measuring device that measures an energy of the calibration ion beam downstream of the energy analyzing magnet, an upstream beamline pressure adjusting device that is connected to the upstream beamline so as to adjust an upstream beamline pressure to a first pressure during an ion implantation process, and a calibration sequence unit that produces an energy calibration table representing a correspondence relation between the known energy and the energy of the calibration ion beam measured by the beam energy measuring device, in which the calibration sequence unit controls the upstream beamline pressure adjusting device so as to adjust the upstream beamline pressure to a second pressure higher than the first pressure while producing the energy calibration table.

2. The ion implantation apparatus according to Embodiment 1, in which the upstream beamline pressure adjusting device is connected to the mass analyzing magnet or a beamline section so as to adjust a pressure in the beamline section from an outlet of the mass analyzing magnet to an inlet of the high-frequency linear accelerator, and the calibration sequence unit controls the upstream beamline pressure adjusting device so as to adjust the pressure in the beamline section to the second pressure while producing the energy calibration table.

3. The ion implantation apparatus according to Embodiment 1 or 2, in which the upstream beamline pressure adjusting device includes a turbomolecular pump connected to the mass analyzing magnet, and the calibration sequence unit stops the turbomolecular pump while producing the energy calibration table.

4. The ion implantation apparatus according to any one of Embodiments 1 to 3, in which the upstream beamline pressure adjusting device includes a turbomolecular pump connected to the mass analyzing magnet and a conductance valve disposed at a vacuum evacuating port of the turbomolecular pump, and the conductance valve is set for a first conductance during the ion implantation process, and the calibration sequence unit sets the conductance valve to a second conductance lower than the first conductance while producing the energy calibration table.

5. The ion implantation apparatus according to any one of Embodiments 1 to 4, in which the upstream beamline pressure adjusting device includes a gas supplying device connected to the upstream beamline, and the calibration sequence unit controls the gas supplying device so as to supply gas to the upstream beamline while producing the energy calibration table.

6. The ion implantation apparatus according to Embodiment 5, in which the gas supplying device is capable of supplying rare gas, nitrogen gas, oxygen gas, or mixed gas containing at least one of rare gas, nitrogen gas, and oxygen gas to the upstream beamline.

7. The ion implantation apparatus according to Embodiment 5 or 6, in which the gas supplying device is capable of supplying xenon gas, krypton gas, or mixed gas containing xenon gas or krypton gas to the upstream beamline.

8. The ion implantation apparatus according to any one of Embodiments 1 to 7, in which the ion source is capable of generating a multiply charged ion of boron, phosphorus, arsenic, argon, xenon, or nitrogen.

9. The ion implantation apparatus according to any one of Embodiments 1 to 8, in which the ion source is capable of generating a multiply charged ion of argon or arsenic.

10. The ion implantation apparatus according to any one of Embodiments 1 to 9, in which the calibration sequence unit controls the high-frequency linear accelerator while producing the energy calibration table such that the high-frequency linear accelerator transfers the calibration ion beam without performing high-frequency acceleration of the calibration ion beam.

11. The ion implantation apparatus according to any one of Embodiments 1 to 10, further including a beam parallelizer that is disposed downstream of the energy analyzing magnet, in which the beam energy measuring device is capable of measuring an energy of an ion beam accelerated by using the high-frequency linear accelerator, and includes a parallelism measuring unit that measures a beam parallelism downstream of the beam parallelizer, and an energy calculating unit that calculates an amount of energy difference from a target beam energy of an ion beam based on a known relationship between a beam energy and a beam parallelism.

12. The ion implantation apparatus according to Embodiment 11, in which the beam parallelizer is configured such that the beam has a focal point on a reference beam trajectory, and the beam parallelizer deflects a plurality of beam trajectories at different deflection angles corresponding to different incidence angles of the plurality of beam trajectories such that the plurality of beam trajectories directed at the different incidence angles from the focal point to the beam parallelizer in a plane including the reference beam trajectory become parallel to the reference beam trajectory by the beam parallelizer under the target beam energy.

It should be understood that the invention is not limited to the above-described embodiment, but may be modified into various forms on the basis of the spirit of the invention. Additionally, the modifications are included in the scope of the invention.

What is claimed is:

1. An ion implantation apparatus comprising:
an ion source that is capable of generating a calibration ion beam including a multiply charged ion which has a known energy corresponding to an extraction voltage;
an upstream beamline that is disposed downstream of the ion source and includes a mass analyzing magnet and a high-frequency linear accelerator;
an energy analyzing magnet that is disposed downstream of the upstream beamline;
a beam energy measuring device that measures an energy of the calibration ion beam downstream of the energy analyzing magnet;
an upstream beamline pressure adjusting device that is connected to the upstream beamline so as to adjust an upstream beamline pressure to a first pressure during an ion implantation process; and
a calibration sequence unit that produces an energy calibration table representing a correspondence relation between the known energy and the energy of the calibration ion beam measured by the beam energy measuring device,
wherein the calibration sequence unit controls the upstream beamline pressure adjusting device so as to adjust the upstream beamline pressure to a second pressure higher than the first pressure while producing the energy calibration table.

2. The ion implantation apparatus according to claim 1,
wherein the upstream beamline pressure adjusting device is connected to the mass analyzing magnet, or to a beamline section from an outlet of the mass analyzing magnet to an inlet of the high-frequency linear accelerator, so as to adjust a pressure in the beamline section, and
the calibration sequence unit controls the upstream beamline pressure adjusting device so as to adjust the pressure in the beamline section to the second pressure while producing the energy calibration table.

3. The ion implantation apparatus according to claim 1,
wherein the upstream beamline pressure adjusting device includes a turbomolecular pump connected to the mass analyzing magnet, and
the calibration sequence unit stops the turbomolecular pump while producing the energy calibration table.

4. The ion implantation apparatus according to claim 1,
wherein the upstream beamline pressure adjusting device includes a turbomolecular pump connected to the mass analyzing magnet and a conductance valve disposed at a vacuum evacuating port of the turbomolecular pump, and the conductance valve is set for a first conductance during the ion implantation process, and
the calibration sequence unit sets the conductance valve to a second conductance lower than the first conductance while producing the energy calibration table.

5. The ion implantation apparatus according to claim 1,
wherein the upstream beamline pressure adjusting device includes a gas supplying device connected to the upstream beamline, and
the calibration sequence unit controls the gas supplying device so as to supply gas to the upstream beamline while producing the energy calibration table.

6. The ion implantation apparatus according to claim 5,
wherein the gas supplying device is capable of supplying rare gas, nitrogen gas, oxygen gas, or mixed gas containing at least one of rare gas, nitrogen gas, and oxygen gas to the upstream beamline.

7. The ion implantation apparatus according to claim 5,
wherein the gas supplying device is capable of supplying xenon gas, krypton gas, or mixed gas containing xenon gas or krypton gas to the upstream beamline.

8. The ion implantation apparatus according to claim 1,
wherein the ion source is capable of generating a multiply charged ion of boron, phosphorus, arsenic, argon, xenon, or nitrogen.

9. The ion implantation apparatus according to claim 1,
wherein the ion source is capable of generating a multiply charged ion of argon or arsenic.

10. The ion implantation apparatus according to claim 1,
wherein the calibration sequence unit controls the high-frequency linear accelerator while producing the energy calibration table such that the high-frequency linear accelerator transfers the calibration ion beam without performing high-frequency acceleration of the calibration ion beam.

11. The ion implantation apparatus according to claim 1, further comprising:
a beam parallelizer that is disposed downstream of the energy analyzing magnet,
wherein the beam energy measuring device is capable of measuring an energy of an ion beam accelerated by using the high-frequency linear accelerator, and includes
a parallelism measuring unit that measures a beam parallelism downstream of the beam parallelizer, and
an energy calculating unit that calculates an amount of energy difference from a target beam energy of an ion beam based on a known relationship between a beam energy and a beam parallelism.

12. The ion implantation apparatus according to claim 11,
wherein the beam parallelizer is configured such that the beam has a focal point on a reference beam trajectory, and
the beam parallelizer deflects a plurality of beam trajectories at different deflection angles corresponding to different incidence angles of the plurality of beam trajectories such that the plurality of beam trajectories directed at the different incidence angles from the focal point to the beam parallelizer in a plane including the reference beam trajectory become parallel to the reference beam trajectory by the beam parallelizer under the target beam energy.

* * * * *